(12) United States Patent
Yanagisawa

(10) Patent No.: US 8,018,693 B2
(45) Date of Patent: Sep. 13, 2011

(54) MAGNETIC DETECTOR INCLUDING MAGNETORESISTIVE ELEMENT AND IMPACT SENSOR

(75) Inventor: Takumi Yanagisawa, Tokyo (JP)

(73) Assignee: TDK Corporation, Tokyo (JP)

( * ) Notice: Subject to any disclaimer, the term of this patent is extended or adjusted under 35 U.S.C. 154(b) by 478 days.

(21) Appl. No.: 12/320,177

(22) Filed: Jan. 21, 2009

(65) Prior Publication Data

US 2010/0182723 A1 Jul. 22, 2010

(51) Int. Cl.
*G11B 5/127* (2006.01)
*G11B 5/33* (2006.01)

(52) U.S. Cl. ........... 360/324.12; 360/324.1; 360/324.11; 360/324.2

(58) Field of Classification Search .............. 360/324.12
See application file for complete search history.

(56) References Cited

U.S. PATENT DOCUMENTS

| | | | |
|---|---|---|---|
| 5,793,207 A | 8/1998 | Gill | |
| 6,349,014 B1 * | 2/2002 | Crue et al. | 360/125.53 |
| 6,411,477 B1 * | 6/2002 | Gill | 360/324.12 |
| 6,985,322 B2 * | 1/2006 | Mian et al. | 360/57 |
| 7,944,650 B2 * | 5/2011 | Tsuchiya et al. | 360/324.1 |
| 2008/0145709 A1 | 6/2008 | Yamashita et al. | |
| 2008/0211490 A1 | 9/2008 | Kurata et al. | |

FOREIGN PATENT DOCUMENTS

| | | |
|---|---|---|
| JP | A-10-208219 | 8/1998 |
| JP | A-2008-134181 | 6/2008 |
| JP | A-2008-152834 | 7/2008 |

* cited by examiner

*Primary Examiner* — Son Mai
(74) *Attorney, Agent, or Firm* — Oliff & Berridge, PLC

(57) ABSTRACT

A magnetic detector includes a magnetoresistive element and an impact sensor. The magnetoresistive element has a plurality of element-constituent layers that are stacked and include a free layer having a magnetization direction that changes in response to a magnetic field to be detected by the magnetic detector. The impact sensor has a plurality of sensor-constituent layers that are made of materials the same as those of the element-constituent layers and stacked in the same order as the element-constituent layers. The plurality of sensor-constituent layers include an impact detecting layer corresponding to the free layer and having a magnetization direction that changes by an inverse magnetostrictive effect in response to distortion created in the impact detecting layer by an impact received by the magnetic detector. The impact detecting layer exhibits a greater amount of change in magnetization direction when the magnetic detector receives an impact, compared with the free layer.

10 Claims, 16 Drawing Sheets

MAGNETIC DETECTOR INCLUDING MAGNETORESISTIVE ELEMENT AND IMPACT SENSOR

BACKGROUND OF THE INVENTION

1. Field of the Invention

The present invention relates to a magnetic detector, a thin-film magnetic head, a head assembly and a magnetic disk drive each of which includes a magnetoresistive element and an impact sensor.

2. Description of the Related Art

A magnetic disk drive includes a recording medium to be driven to rotate, and a thin-film magnetic head for writing data on and reading data from the recording medium. The thin-film magnetic head for use in the magnetic disk drive is typically in the form of a slider with a thin-film magnetic head element (hereinafter, also simply referred to as a head element) provided at a rear end thereof. In the magnetic disk drive the slider is flexibly supported by a suspension so as to face toward the recording medium. In the magnetic disk drive, when the recording medium rotates, an airflow passes between the recording medium and the slider and causes a lift to be exerted on the slider. This lift causes the slider to slightly fly over the surface of the recording medium.

Typically, a head element includes a magnetoresistive element (hereinafter, also referred to as an MR element) for reading and an induction-type electromagnetic transducer for writing. Examples of the MR element include a giant magnetoresistive (GMR) element utilizing a giant magnetoresistive effect, and a tunneling magnetoresistive (TMR) element utilizing a tunneling magnetoresistive effect.

A spin-valve GMR element and a TMR element each typically include a free layer, a pinned layer, a spacer layer disposed between the free layer and the pinned layer, and an antiferromagnetic layer disposed on a side of the pinned layer farther from the spacer layer. The free layer is a ferromagnetic layer whose magnetization direction changes in response to a signal magnetic field. The pinned layer is a ferromagnetic layer whose magnetization direction is fixed. The antiferromagnetic layer is a layer that fixes the magnetization direction of the pinned layer by means of exchange coupling with the pinned layer. The spacer layer is a nonmagnetic conductive layer in a spin-valve GMR element, and is a tunnel barrier layer in a TMR element.

In a magnetic disk drive, if there are protrusions on the surface of the recording medium caused by, for example, adhesion of foreign substances or defects of the recording medium, the magnetic head may collide with the protrusions. It is difficult to perform proper reading and writing in portions of the recording medium with which the magnetic head collides. To cope with this, such measures are taken that portions of the recording medium with which the magnetic head collides are detected in advance, and the operation of the magnetic disk drive is controlled so as to prevent the magnetic head from passing over those portions and/or a pass or fail of the recording medium is determined based on the number of protrusions with which the magnetic head collides.

As disclosed in U.S. Pat. No. 5,793,207, it is known that a collision of a magnetic head with a recording medium causes a sudden increase in temperature of the MR element. Accordingly, in a case of a magnetic head using an MR element having a high resistance-temperature coefficient, that is, a high ratio of change in resistance with respect to a change in temperature, it is possible to detect a collision of the magnetic head with the recording medium by detecting a sudden change in resistance of the MR element associated with a sudden increase in temperature of the MR element. However, for a magnetic head using an MR element having a low resistance-temperature coefficient such as a TMR element, it is difficult to detect a collision of the magnetic head with the recording medium through the above-described method.

The free layer of an MR element typically has a non-zero magnetostriction constant. Consequently, when the magnetic head suffers an impact due to a collision with the recording medium and distortion thereby occurs in the free layer, the magnetization direction of the free layer changes by an inverse magnetostrictive effect. Hence it is possible to detect a collision of the magnetic head with the recording medium by detecting a change in resistance of the MR element occurring upon a change in magnetization direction of the free layer. However, this method has the following problem.

In an MR element, typically, the magnetization direction of the free layer is in a specific direction such as the track width direction when the free layer is in a state in which a bias magnetic field is applied but no signal magnetic field is applied thereto. Accordingly, in order for the free layer to resist the bias magnetic field and thereby exhibit a great change in magnetization direction by the inverse magnetostrictive effect when the magnetic head suffers an impact, it is necessary that the free layer have a magnetostriction constant having a large absolute value. However, if the free layer has a magnetostriction constant having a large absolute value, the magnetic anisotropy of the free layer greatly varies depending on the magnitude of stress that the layers constituting the MR element or the layers neighboring the MR element inherently have, and/or the magnitude of stress generated in the layers constituting the MR element or the layers neighboring the MR element due to a change in temperature of the magnetic head. Therefore, the free layer having a magnetostriction constant having a large absolute value is undesirable for the characteristics of the MR element although it is desirable in detecting an impact on the magnetic head.

Another possible approach is to provide a sensor in the magnetic head separate from the MR element, for detecting a collision of the magnetic head with the recording medium. However, this requires a process dedicated to forming the sensor in the manufacture of the magnetic head and thereby makes the manufacturing process for the magnetic head more complicated.

U.S. Patent Application Publication No. 2008/0211490 A1 discloses a magnetic detector including an MR element and a fixed resistor, the fixed resistor having a resistance that does not change in response to an external magnetic field. The MR element and the fixed resistor are formed of the same laminates on one substrate and are connected to each other in series. In this magnetic detector, hard bias layers are provided with spacing on both sides of the fixed resistor, and the magnetization direction of a magnetic layer of the fixed resistor corresponding to the free layer of the MR element is fixed by a bias magnetic field sent from the hard bias layers. As a result, even if the magnetic head suffers an impact, the magnetization direction of the magnetic layer of the fixed resistor corresponding to the free layer will not change easily. It is therefore difficult with the fixed resistor of this magnetic detector to detect an impact on the magnetic head.

OBJECT AND SUMMARY OF THE INVENTION

It is an object of the present invention to provide a magnetic detector, a thin-film magnetic head, a head assembly and a magnetic disk drive each of which includes a magnetoresistive element and an impact sensor and is capable of detecting an impact without affecting the characteristics of the magnetoresistive element.

A magnetic detector of the present invention includes a magnetoresistive element and an impact sensor. The magnetoresistive element has a plurality of element-constituent layers that are stacked and include a free layer, the free layer having a magnetization direction that changes in response to a magnetic field to be detected by the magnetic detector. The impact sensor has a plurality of sensor-constituent layers that are made of materials the same as those of the plurality of element-constituent layers and stacked in an order the same as the plurality of element-constituent layers. The plurality of sensor-constituent layers include an impact detecting layer, the impact detecting layer corresponding to the free layer and having a magnetization direction that changes by an inverse magnetostrictive effect in response to distortion created in the impact detecting layer by an impact received by the magnetic detector. The impact detecting layer exhibits a greater amount of change in magnetization direction when the magnetic detector receives an impact, compared with the free layer.

The magnetic detector of the present invention may further include a bias magnetic field applying layer for the element, for applying to the free layer a bias magnetic field for the element for directing the magnetization direction of the free layer to a specific direction when the magnetic detector is in a state in which the magnetic field to be detected is not applied thereto. In this case, it is not required that the impact detecting layer undergo application of any magnetic field intended for directing the magnetization direction of the impact detecting layer to a specific direction when the magnetic detector is in a state in which the magnetic field to be detected is not applied thereto.

When the magnetic detector of the present invention includes the bias magnetic field applying layer for the element, the magnetic detector may further include a bias magnetic field applying layer for the sensor, for applying to the impact detecting layer a bias magnetic field for the sensor for directing the magnetization direction of the impact detecting layer to a specific direction when the magnetic detector is in a state in which the magnetic field to be detected is not applied thereto. In this case, the bias magnetic field for the sensor may be smaller in magnitude than the bias magnetic field for the element. Alternatively, the impact detecting layer may have a magnetic shape anisotropy that generates an anisotropic magnetic field that is smaller than the bias magnetic field for the sensor and that is in a direction intersecting the bias magnetic field for the sensor at a right angle.

In the magnetic detector of the present invention, the plurality of element-constituent layers may further include a pinned layer having a fixed magnetization direction, and a spacer layer made of a nonmagnetic material and disposed between the free layer and the pinned layer.

The magnetic detector of the present invention may further include a detecting surface that receives the magnetic field to be detected. In this case, the magnetoresistive element may have an end face located in the detecting surface. In addition, the impact sensor may be disposed away from the detecting surface.

A thin-film magnetic head of the present invention includes: a medium facing surface that faces toward a recording medium; a magnetoresistive element disposed near the medium facing surface to detect a signal magnetic field sent from the recording medium; and an impact sensor. The magnetoresistive element has a plurality of element-constituent layers that are stacked and include a free layer, the free layer having a magnetization direction that changes in response to the signal magnetic field. The impact sensor has a plurality of sensor-constituent layers that are made of materials the same as those of the plurality of element-constituent layers and stacked in an order the same as the plurality of element-constituent layers. The plurality of sensor-constituent layers include an impact detecting layer, the impact detecting layer corresponding to the free layer and having a magnetization direction that changes by an inverse magnetostrictive effect in response to distortion created in the impact detecting layer by an impact received by the thin-film magnetic head. The impact detecting layer exhibits a greater amount of change in magnetization direction when the thin-film magnetic head receives an impact, compared with the free layer.

A head assembly of the present invention includes: a slider disposed to face toward a recording medium; and a supporter flexibly supporting the slider, the slider including the thin-film magnetic head of the invention.

A magnetic disk drive of the present invention includes: a slider disposed to face toward a recording medium that is driven to rotate; and an alignment device supporting the slider and aligning the slider with respect to the recording medium, the slider including the thin-film magnetic head of the invention.

In each of the magnetic detector, the thin-film magnetic head, the head assembly and the magnetic disk drive of the present invention, the impact sensor has a plurality of sensor-constituent layers that are made of materials the same as those of the plurality of element-constituent layers and stacked in an order the same as the plurality of element-constituent layers. The impact detecting layer of the impact sensor corresponding to the free layer of the magnetoresistive element exhibits a greater amount of change in magnetization direction when an impact is received, compared with the free layer. Consequently, according to the present invention, it is possible with the impact sensor to detect an impact without affecting the characteristics of the magnetoresistive element. Furthermore, according to the present invention, it is possible to form the impact sensor at the same time as the magnetoresistive element.

Other and further objects, features and advantages of the present invention will appear more fully from the following description.

DETAILED DESCRIPTION OF THE PREFERRED EMBODIMENTS

First Embodiment

Figure 6:
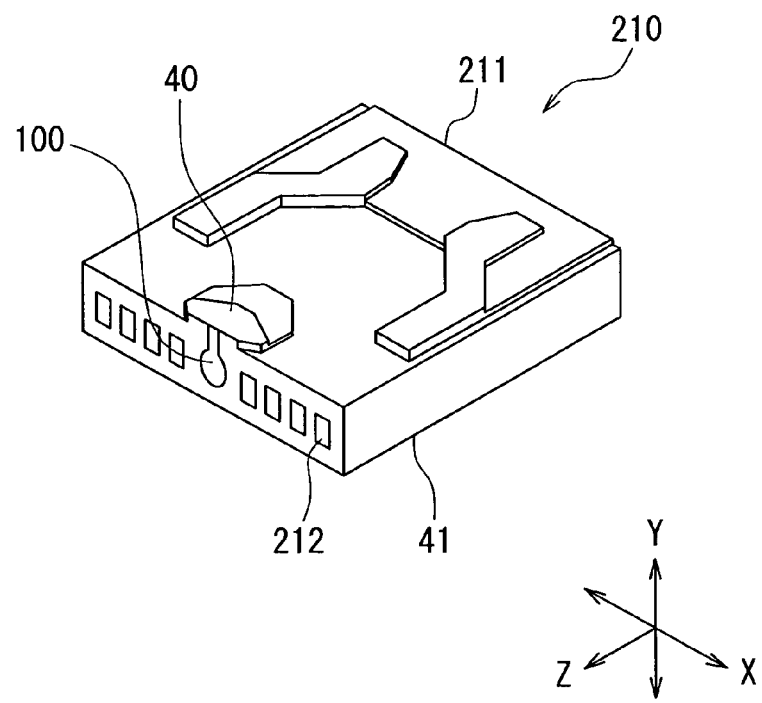
FIG. 6 is a perspective view of a slider including the thin-film magnetic head according to the first embodiment of the present invention.

Embodiments of the present invention will now be described in detail with reference to the drawings. Reference is first made to FIG. 6 to describe a slider 210 including a thin-film magnetic head according to a first embodiment of the present invention. In a magnetic disk drive the slider 210 is placed to face toward a circular-plate-shaped recording medium (a magnetic disk platter) that is driven to rotate. In FIG. 6 the X direction is across the tracks of the recording medium, the Y direction is perpendicular to the surface of the recording medium, and the Z direction is the direction of travel of the recording medium as seen from the slider 210. The X, Y and Z directions are orthogonal to one another. The slider 210 has a base body 211. The base body 211 is nearly hexahedron-shaped. One of the six surfaces of the base body 211 is designed to face toward the surface of the recording medium. At this one of the six surfaces, there is formed a medium facing surface 40 to face toward the recording medium. When the recording medium rotates and travels in the Z direction, an airflow passing between the recording medium and the slider 210 causes a lift below the slider 210 in the Y direction of FIG. 6. This lift causes the slider 210 to fly over the surface of the recording medium. The thin-film magnetic head 100 according to the present embodiment is formed near the air-outflow-side end (the end located at the lower left of FIG. 6) of the slider 210. Eight terminals 212 are also provided at the air-outflow-side end of the slider 210.

A head assembly according to the present embodiment will now be described with reference to FIG. 7. The head assembly according to the present embodiment includes the slider 210 shown in FIG. 6 and a supporter that flexibly supports the slider 210. Forms of this head assembly include a head gimbal assembly and a head arm assembly described below.

The head gimbal assembly 220 will be first described. The head gimbal assembly 220 includes the slider 210, and a suspension 221 serving as the supporter that flexibly supports the slider 210. The suspension 221 has: a plate-spring-shaped load beam 222 formed of, e.g., stainless steel; a flexure 223 to which the slider 210 is joined, the flexure 223 being provided at an end of the load beam 222 and giving an appropriate degree of freedom to the slider 210; and a base plate 224 provided at the other end of the load beam 222. The base plate 224 is configured to be attached to an arm 230 of an actuator for moving the slider 210 along the X direction across the tracks of a magnetic disk platter 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms with a plurality of head gimbal assemblies 220 respectively attached to the arms is called a head stack assembly.

Figure 7:
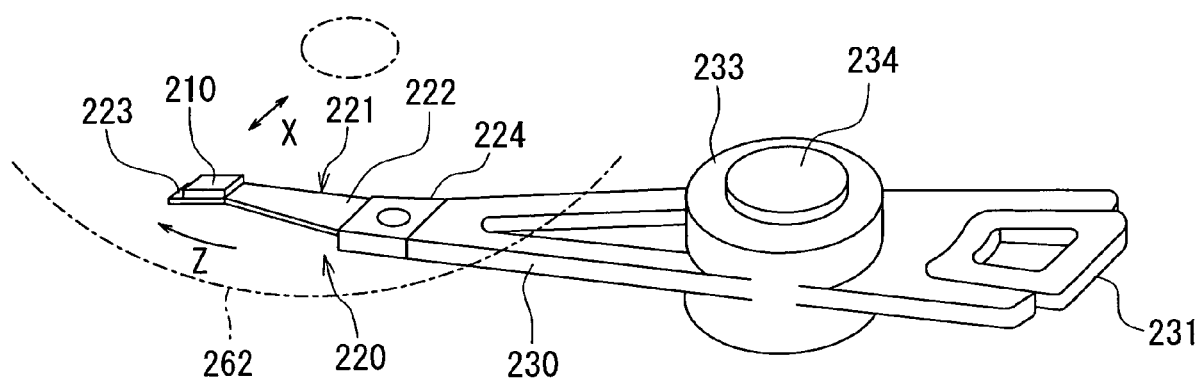
FIG. 7 is a perspective view of a head arm assembly according to the first embodiment of the present invention.

FIG. 7 shows the head arm assembly according to the present embodiment. In this head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to a shaft 234 that rotatably supports the arm 230.

Figure 8:
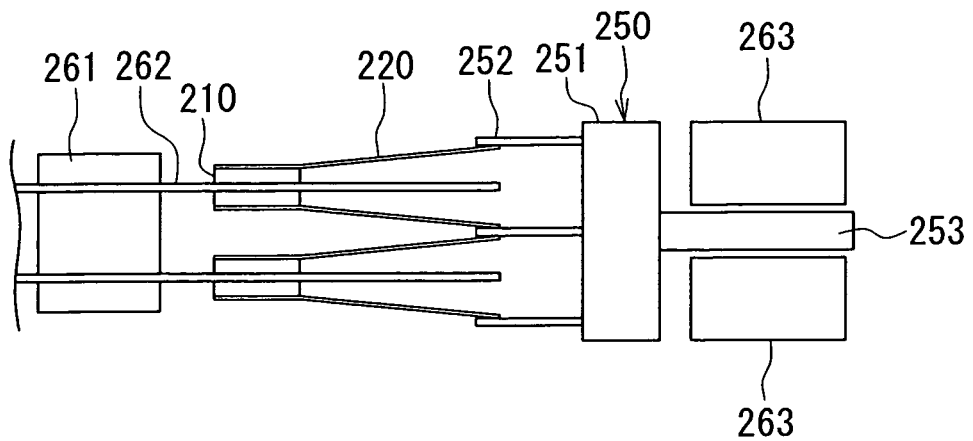
FIG. 8 is an illustrative view for illustrating a main part of a magnetic disk drive according to the first embodiment of the present invention.
Figure 9:
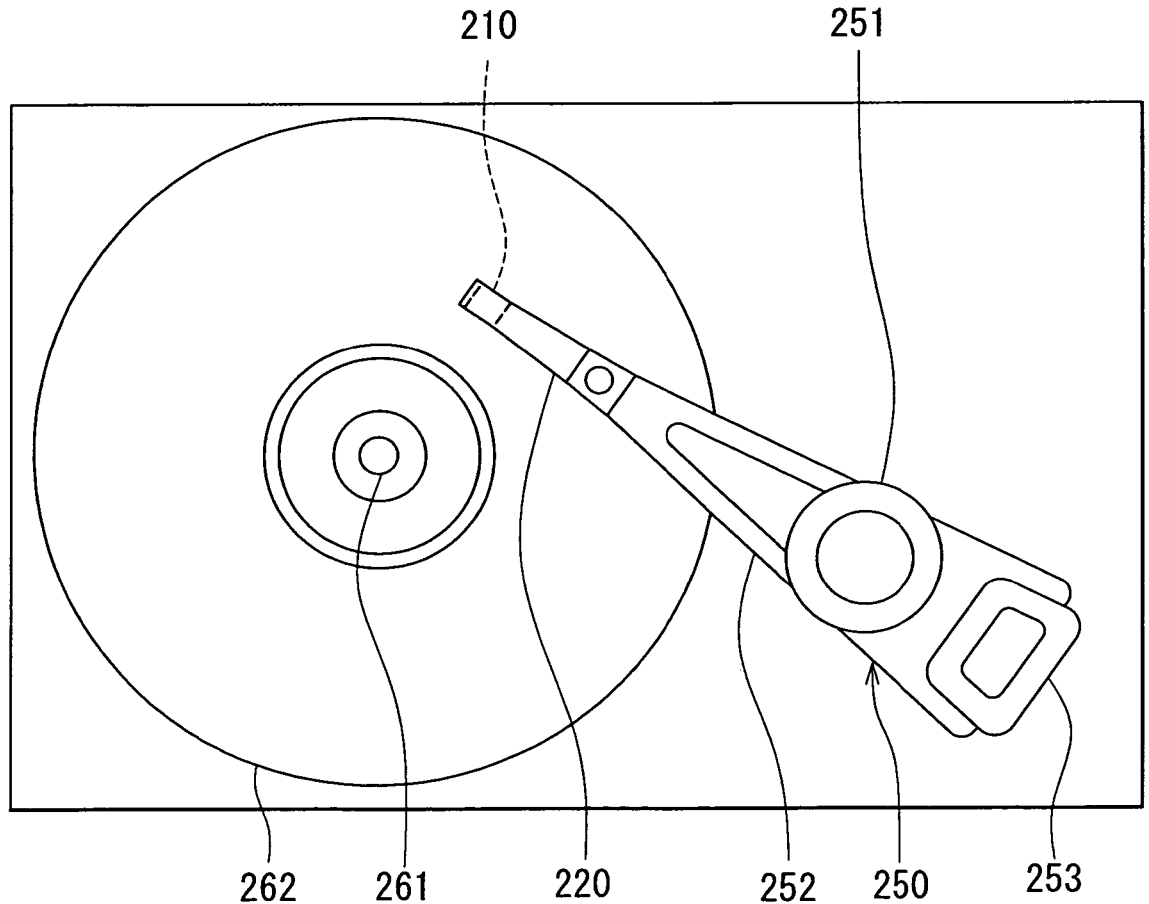
FIG. 9 is a plan view of the magnetic disk drive according to the first embodiment of the present invention.

Reference is now made to FIG. 8 and FIG. 9 to describe an example of the head stack assembly and the magnetic disk drive according to the present embodiment. FIG. 8 is an illustrative view showing a main part of the magnetic disk drive. FIG. 9 is a plan view of the magnetic disk drive. The head stack assembly 250 includes a carriage 251 having a plurality of arms 252. A plurality of head gimbal assemblies 220 are attached to the arms 252 such that the assemblies 220 are aligned in the vertical direction with spacing between every adjacent ones. A coil 253 that is part of the voice coil motor is mounted on a side of the carriage 251 opposite to the arms 252. The head stack assembly 250 is installed in the magnetic disk drive. The magnetic disk drive includes a plurality of magnetic disk platters 262 mounted on a spindle motor 261. Two sliders 210 are allocated to each magnetic disk platter 262 such that the two sliders 210 are opposed to each other with the platter 262 disposed in between. The voice coil motor includes permanent magnets 263 disposed to be opposed to each other, the coil 253 of the head stack assembly 250 being placed between the magnets 263. The actuator and the head stack assembly 250 except the sliders 210 support the sliders 210 and align them with respect to the magnetic disk platters 262.

In the magnetic disk drive according to the present embodiment, the actuator moves the slider 210 across the tracks of the magnetic disk platter 262 and aligns the slider 210 with respect to the magnetic disk platter 262. The thin-film magnetic head included in the slider 210 writes data on the magnetic disk platter 262 by using a write head, and reads data stored on the magnetic disk platter 262 by using a read head.

Figure 4:
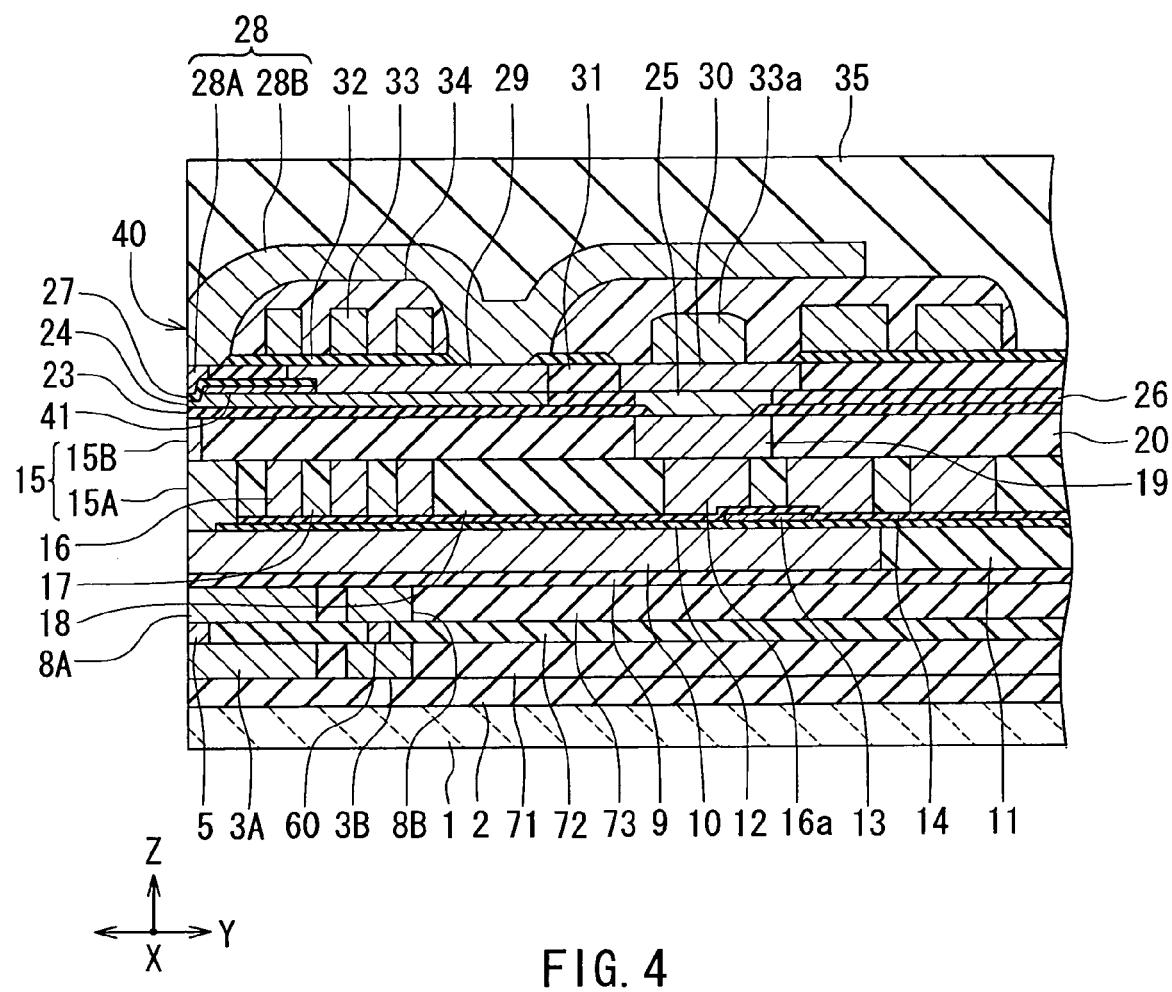
FIG. 4 is a cross-sectional view showing the configuration of a thin-film magnetic head according to the first embodiment of the present invention.
Figure 5:
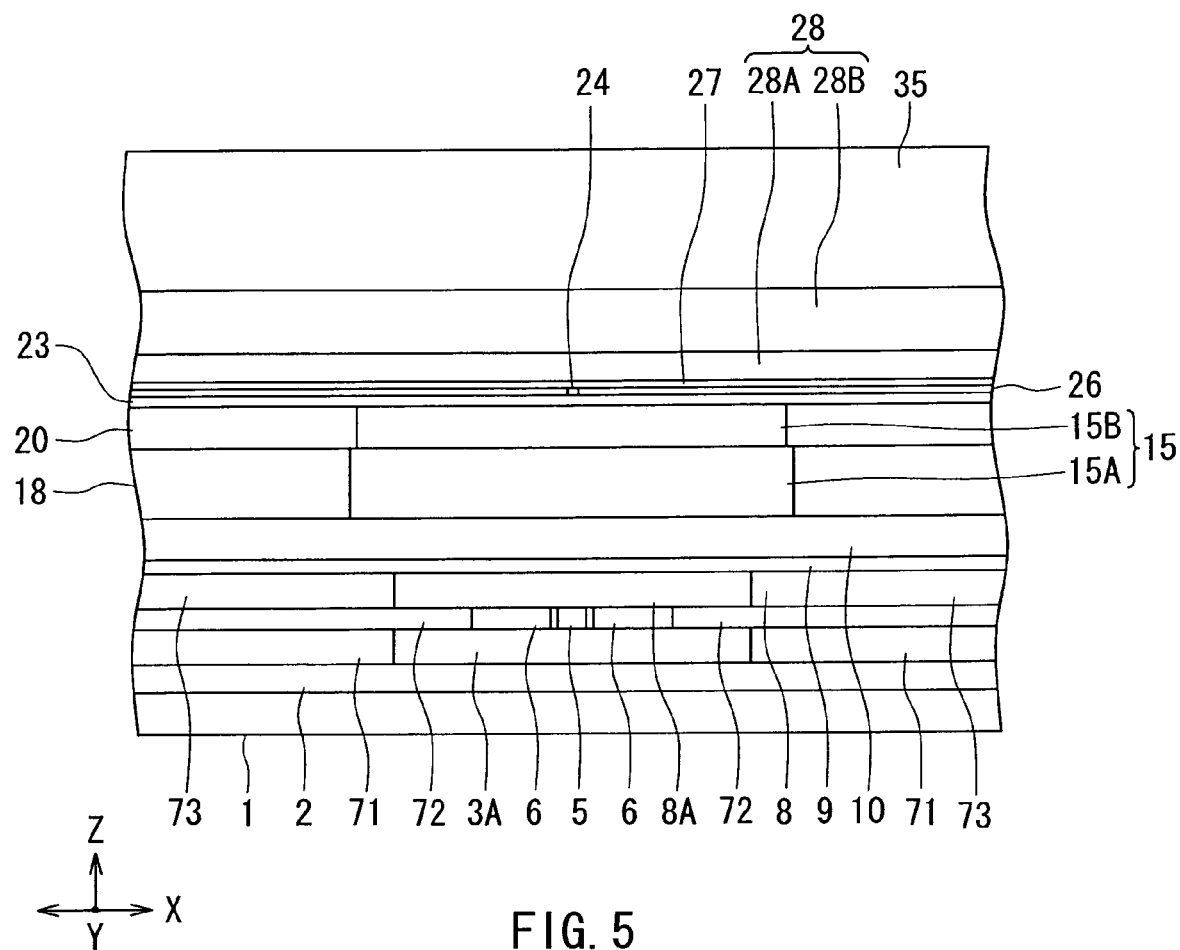
FIG. 5 is a front view showing the medium facing surface of the thin-film magnetic head according to the first embodiment of the present invention.

Reference is now made to FIG. 4 and FIG. 5 to describe the configuration of the thin-film magnetic head according to the present embodiment. FIG. 4 is a cross-sectional view showing the configuration of the thin-film magnetic head. FIG. 5 is a front view showing the medium facing surface of the thin-film magnetic head. Note that FIG. 4 shows a cross section perpendicular to the medium facing surface and the top surface of the substrate. The X, Y and Z directions shown in FIG. 6 are also shown in FIG. 4 and FIG. 5. In FIG. 4 the X direction is orthogonal to the Y and Z directions. In FIG. 5 the Y direction is orthogonal to the X and Z directions.

As shown in FIG. 4, the thin-film magnetic head according to the present embodiment has the medium facing surface 40 that faces toward the recording medium. As shown in FIG. 4 and FIG. 5, the thin-film magnetic head includes: a substrate 1 made of a ceramic material such as aluminum oxide-titanium carbide ($Al_2O_3$—TiC); an insulating layer 2 disposed on the substrate 1; a lower shield 3A for the element and a lower shield 3B for the sensor that are disposed on the insulating layer 2 and separated from each other; and an insulating layer 71 disposed around the lower shield 3A for the element and the lower shield 3B for the sensor. The insulating layers 2 and 71 are each made of an insulating material such as alumina ($Al_2O_3$). The lower shield 3A for the element and the lower shield 3B for the sensor are each made of a magnetic material. The lower shield 3A for the element has an end face located in the medium facing surface 40. The lower shield 3B for the sensor is disposed on a side of the lower shield 3A for the element farther from the medium facing surface 40.

Although not shown in FIG. 4 and FIG. 5, the thin-film magnetic head further includes one lead connected to the lower shield 3A for the element and another lead connected to the lower shield 3B for the sensor. These leads are made of a conductive material such as copper.

The thin-film magnetic head further includes: an MR element 5 disposed on the lower shield 3A for the element; two bias magnetic field applying layers 6 disposed on the lower shield 3A for the element and adjacent to two side surfaces of the MR element 5 that are opposite to each other in the track width direction, with insulating films (not shown) provided between the MR element 5 and the respective bias magnetic field applying layers 6; an impact sensor 60 disposed on the lower shield 3B for the sensor; and an insulating layer 72 disposed around the MR element 5, the bias magnetic field applying layers 6 and the impact sensor 60. The MR element 5 has an end face located in the medium facing surface 40. The impact sensor 60 is disposed away from the medium facing surface 40. The insulating layer 72 is made of an insulating material such as alumina.

The thin-film magnetic head further includes: an upper shield 8A for the element that is disposed on the MR element 5, the bias magnetic field applying layers 6 and the insulating layer 72; an upper shield 8B for the sensor that is disposed on the impact sensor 60 and the insulating layer 72; and an insulating layer 73 disposed around the upper shield 8A for the element and the upper shield 8B for the sensor. Each of the upper shield 8A for the element and the upper shield 8B for the sensor is made of a magnetic material. The upper shield 8A for the element has an end face located in the medium facing surface 40. The upper shield 8B for the sensor is disposed on a side of the upper shield 8A for the element farther from the medium facing surface 40, and spaced from the upper shield 8A for the element. The insulating layer 73 is made of an insulating material such as alumina.

Although not shown in FIG. 4 and FIG. 5, the thin-film magnetic head further includes one lead connected to the upper shield 8A for the element and another lead connected to the upper shield 8B for the sensor. These leads are made of a conductive material such as copper.

The thin-film magnetic head further includes a separating layer 9 made of a nonmagnetic material such as alumina and disposed on the upper shield 8A for the element, the upper shield 8B for the sensor and the insulating layer 73. The portion between the insulating layer 2 and the separating layer 9 constitutes a magnetic detector according to the present embodiment. The magnetic detector constitutes a read head of the thin-film magnetic head.

The MR element 5 has a plurality of element-constituent layers that are stacked and that include a free layer whose magnetization direction changes in response to a signal magnetic field that is a magnetic field to be detected by the magnetic detector. For example, the MR element 5 has a CPP (current perpendicular to plane) structure in which a sense current that is a current for use for detecting the signal magnetic field is fed in a direction intersecting the planes of the layers constituting the MR element 5, such as the direction perpendicular to the planes of the layers constituting the MR element 5. The MR element 5 is a TMR element or a GMR element, for example. The impact sensor 60 is a sensor for detecting an impact on the thin-film magnetic head occurring due to, for example, a collision of the slider 210 with the recording medium. The impact sensor 60 has a plurality of sensor-constituent layers that are made of materials the same as those of the plurality of element-constituent layers and stacked in the same order as the element-constituent layers. The configuration of the MR element 5 and the impact sensor 60 will be described in detail later.

The thin-film magnetic head further includes: a magnetic layer 10 made of a magnetic material and disposed on the separating layer 9; and an insulating layer 11 made of an insulating material such as alumina and disposed around the magnetic layer 10. The magnetic layer 10 has an end face located in the medium facing surface 40. The magnetic layer 10 and the insulating layer 11 have flattened top surfaces.

The thin-film magnetic head further includes: an insulating film 12 disposed on the magnetic layer 10 and the insulating layer 11; a heater 13 disposed on the insulating film 12; and an insulating film 14 disposed on the insulating film 12 and the heater 13 such that the heater 13 is sandwiched between the insulating films 12 and 14. The function and material of the heater 13 will be described later. The insulating films 12 and 14 are made of an insulating material such as alumina.

The thin-film magnetic head further includes a first write shield 15 disposed on the magnetic layer 10. The first write shield 15 includes a first layer 15A disposed on the magnetic layer 10, and a second layer 15B disposed on the first layer 15A. The first layer 15A and the second layer 15B are made of a magnetic material. Each of the first layer 15A and the second layer 15B has an end face located in the medium facing surface 40.

The thin-film magnetic head further includes: a coil 16 made of a conductive material and disposed on the insulating film 14; an insulating layer 17 that fills the space between the coil 16 and the first layer 15A and the space between every adjacent turns of the coil 16; and an insulating layer 18 disposed around the first layer 15A, the coil 16 and the insulating layer 17. The coil 16 is planar spiral-shaped. The coil 16 includes a connecting portion 16a that is a portion near an inner end of the coil 16 and connected to another coil described later. The insulating layer 17 is made of photoresist, for example. The insulating layer 18 is made of alumina, for example. The first layer 15A, the coil 16, the insulating layer 17 and the insulating layer 18 have flattened top surfaces.

The thin-film magnetic head further includes: a connecting layer 19 made of a conductive material and disposed on the connecting portion 16a; and an insulating layer 20 made of an insulating material such as alumina and disposed around the second layer 15B and the connecting layer 19. The connecting layer 19 may be made of the same material as the second layer 15B. The second layer 15B, the connecting layer 19 and the insulating layer 20 have flattened top surfaces.

The thin-film magnetic head further includes a first gap layer 23 disposed on the second layer 15B, the connecting layer 19 and the insulating layer 20. The first gap layer 23 has an opening formed in a region corresponding to the top surface of the connecting layer 19. The first gap layer 23 is made of a nonmagnetic insulating material such as alumina.

The thin-film magnetic head further includes: a pole layer 24 made of a magnetic material and disposed on the first gap layer 23; a connecting layer 25 made of a conductive material and disposed on the connecting layer 19; and an insulating layer 26 made of an insulating material such as alumina and disposed around the pole layer 24 and the connecting layer 25. The pole layer 24 has an end face located in the medium facing surface 40. The connecting layer 25 is connected to the connecting layer 19 through the opening of the first gap layer 23. The connecting layer 25 may be made of the same material as the pole layer 24.

The thin-film magnetic head further includes a nonmagnetic layer 41 made of a nonmagnetic material and disposed on part of the top surface of the pole layer 24. The nonmagnetic layer 41 is made of, for example, an inorganic insulating material or a metal material. Examples of the inorganic insulating material to be used for the nonmagnetic layer 41 include alumina and $SiO_2$. Examples of the metal material to be used for the nonmagnetic layer 41 include Ru and Ti.

The thin-film magnetic head further includes a second gap layer 27 disposed on part of the pole layer 24 and on the nonmagnetic layer 41. A portion of the top surface of the pole layer 24 apart from the medium facing surface 40 and the top surface of the connecting layer 25 are not covered with the nonmagnetic layer 41 and the second gap layer 27. The second gap layer 27 is made of a nonmagnetic material such as alumina.

The thin-film magnetic head further includes a second write shield 28 disposed on the second gap layer 27. The second write shield 28 includes: a first layer 28A disposed adjacent to the second gap layer 27; and a second layer 28B disposed on a side of the first layer 28A farther from the second gap layer 27 and connected to the first layer 28A. The first layer 28A and the second layer 28B are made of a magnetic material. Each of the first layer 28A and the second layer 28B has an end face located in the medium facing surface 40.

The thin-film magnetic head further includes: a yoke layer 29 made of a magnetic material and disposed on a portion of the pole layer 24 away from the medium facing surface 40; a connecting layer 30 made of a conductive material and disposed on the connecting layer 25; and an insulating layer 31 made of an insulating material such as alumina and disposed around the first layer 28A, the yoke layer 29 and the connecting layer 30. The yoke layer 29 and the connecting layer 30 may be made of the same material as the first layer 28A. The first layer 28A, the yoke layer 29, the connecting layer 30 and the insulating layer 31 have flattened top surfaces.

The thin-film magnetic head further includes an insulating layer 32 made of an insulating material such as alumina and disposed on the yoke layer 29 and the insulating layer 31. The insulating layer 32 has an opening for exposing the top surface of the first layer 28A, an opening for exposing a portion of the top surface of the yoke layer 29 near an end thereof farther from the medium facing surface 40, and an opening for exposing the top surface of the connecting layer 30.

The thin-film magnetic head further includes a coil 33 made of a conductive material and disposed on the insulating layer 32. The coil 33 is planar spiral-shaped. The coil 33 includes a connecting portion 33a that is a portion near an inner end of the coil 33 and connected to the connecting portion 16a of the coil 16. The connecting portion 33a is connected to the connecting layer 30, and connected to the connecting portion 16a through the connecting layers 19, 25 and 30.

The thin-film magnetic head further includes an insulating layer 34 disposed to cover the coil 33. The insulating layer 34 is made of photoresist, for example. The second layer 28B of the second write shield 28 is disposed on the first layer 28A, the yoke layer 29 and the insulating layer 34, and connects the first layer 28A and the yoke layer 29 to each other.

The thin-film magnetic head further includes an overcoat layer 35 made of an insulating material such as alumina and disposed to cover the second layer 28B. The portion from the magnetic layer 10 to the second layer 28B constitutes a write head. The base body 211 of FIG. 6 is mainly composed of the substrate 1 and the overcoat layer 35 of FIG. 4.

As described so far, the thin-film magnetic head includes the medium facing surface 40 that faces toward the recording medium, the read head, and the write head. The read head and the write head are stacked on the substrate 1. The read head is disposed backward along the direction of travel of the recording medium (the Z direction) (in other words, disposed closer to an air-inflow end of the slider), while the write head is disposed forward along the direction of travel of the recording medium (the Z direction) (in other words, disposed closer to an air-outflow end of the slider). The thin-film magnetic head writes data on the recording medium through the use of the write head, and reads data stored on the recording medium through the use of the read head.

The read head includes: the lower shield 3A for the element and the upper shield 8A for the element; and the MR element 5 disposed between the lower shield 3A for the element and the upper shield 8A for the element near the medium facing surface 40 in order to detect a signal magnetic field sent from the recording medium. The MR element 5 has a CPP structure, for example. The lower shield 3A for the element and the upper shield 8A for the element also serve as a pair of electrodes for feeding a sense current to the MR element 5 in a direction intersecting the planes of the layers constituting the MR element 5, such as the direction perpendicular to the planes of the layers constituting the MR element 5. Alternatively, a pair of electrodes may be provided above and below the MR element 5, besides the lower and upper shields 3A and 8A. The MR element 5 exhibits a change in resistance in response to a signal magnetic field sent from the recording medium. The resistance of the MR element 5 can be determined from the sense current. It is thus possible, using the read head, to read data stored on the recording medium.

The write head includes the magnetic layer 10, the first write shield 15, the coil 16, the first gap layer 23, the pole layer 24, the nonmagnetic layer 41, the second gap layer 27, the second write shield 28, the yoke layer 29, and the coil 33. The first write shield 15 is located closer to the substrate 1 than is the second write shield 28. The pole layer 24 is located closer to the substrate 1 than is the second write shield 28.

The coils 16 and 33 are connected to two of the eight terminals 212 provided in the slider 210. The coils 16 and 33 generate a magnetic field that corresponds to data to be written on the recording medium. The pole layer 24 has an end face located in the medium facing surface 40, allows a magnetic flux corresponding to the magnetic field generated by the coils 16 and 33 to pass, and generates a write magnetic field used for writing the data on the recording medium by means of a perpendicular magnetic recording system.

The first write shield 15 is made of a magnetic material, and has an end face located in the medium facing surface 40 at a position backward of the end face of the pole layer 24 along the direction of travel of the recording medium (the Z direction) (in other words, a position closer to the air-inflow end of the slider). The first gap layer 23 is made of a nonmagnetic material, has an end face located in the medium facing surface 40, and is disposed between the first write shield 15 and the pole layer 24. In the present embodiment the first write shield 15 includes the first layer 15A disposed on the magnetic layer 10, and the second layer 15B disposed on the first layer 15A. Part of the coil 16 is located on a side of the first layer 15A farther from the medium facing surface 40 so as to pass through the space between the magnetic layer 10 and the pole layer 24.

The magnetic layer 10 has a function of returning a magnetic flux that has been generated from the end face of the pole layer 24 and has magnetized the recording medium. FIG. 4 shows an example in which the magnetic layer 10 has an end face located in the medium facing surface 40. However, since the magnetic layer 10 is connected to the first write shield 15 having an end face located in the medium facing surface 40, the magnetic layer 10 may have an end face that is closer to the medium facing surface 40 and located at a distance from the medium facing surface 40.

In the medium facing surface 40, the end face of the first write shield 15 (the end face of the second layer 15B) is located backward of the end face of the pole layer 24 along the direction of travel of the recording medium (the Z direction) (in other words, located closer to the air-inflow end of the slider) with a predetermined small distance provided therebetween by the first gap layer 23. The distance between the end face of the pole layer 24 and the end face of the first write shield 15 in the medium facing surface 40 is preferably within a range of 0.05 to 0.7 μm, or more preferably within a range of 0.1 to 0.3 μm.

The first write shield 15 takes in a magnetic flux that is generated from the end face of the pole layer 24 located in the medium facing surface 40 and that expands in directions except the direction perpendicular to the plane of the recording medium, and thereby prevents this flux from reaching the recording medium. It is thereby possible to improve the recording density.

The second write shield 28 is made of a magnetic material, and has an end face located in the medium facing surface 40 at a position forward of the end face of the pole layer 24 along the direction of travel of the recording medium (the Z direction) (in other words, a position closer to the air-outflow end of the slider). The second gap layer 27 is made of a nonmagnetic material, has an end face located in the medium facing surface 40, and is disposed between the second write shield 28 and the pole layer 24. In the present embodiment the second write shield 28 includes the first layer 28A disposed adjacent to the second gap layer 27, and the second layer 28B disposed on a side of the first layer 28A farther from the second gap layer 27 and connected to the first layer 28A. Part of the coil 33 is disposed to pass through the space surrounded by the pole layer 24 and the second write shield 28. The second write shield 28 is connected to a portion of the yoke layer 29 away from the medium facing surface 40. The second write shield 28 is thus connected to a portion of the pole layer 24 away from the medium facing surface 40 through the yoke layer 29. The pole layer 24, the second write shield 28 and the yoke layer 29 form a magnetic path for passing a magnetic flux corresponding to the magnetic field generated by the coil 33.

In the medium facing surface 40, the end face of the second write shield 28 (the end face of the first layer 28A) is located forward of the end face of the pole layer 24 along the direction of travel of the recording medium (the Z direction) (in other words, located closer to the air-outflow end of the slider) with a predetermined small distance provided therebetween by the second gap layer 27. The distance between the end face of the pole layer 24 and the end face of the second write shield 28 in the medium facing surface 40 is preferably equal to or smaller than 200 nm, or more preferably within a range of 25 to 50 nm, so that the second write shield 28 can fully exhibit its function as a shield.

The position of the end of a bit pattern to be written on the recording medium is determined by the position of an end of the pole layer 24 closer to the second gap layer 27 in the medium facing surface 40. The second write shield 28 takes in a magnetic flux that is generated from the end face of the pole layer 24 located in the medium facing surface 40 and that expands in directions except the direction perpendicular to the plane of the recording medium, and thereby prevents this flux from reaching the recording medium. It is thereby possible to improve the recording density. Furthermore, the second write shield 28 takes in a disturbance magnetic field applied from outside the thin-film magnetic head to the thin-film magnetic head. It is thereby possible to prevent erroneous writing on the recording medium caused by the disturbance magnetic field intensively taken into the pole layer 24. The second write shield 28 also has a function of returning a magnetic flux that has been generated from the end face of the pole layer 24 and has magnetized the recording medium.

FIG. 4 shows an example in which neither the magnetic layer 10 nor the first write shield 15 is connected to the pole layer 24. However, the magnetic layer 10 may be connected to a portion of the pole layer 24 away from the medium facing surface 40. The coil 16 is not an essential component of the write head and can be dispensed with. In the example shown in FIG. 4, the yoke layer 29 is disposed on the pole layer 24, or in other words, disposed forward of the pole layer 24 along the direction of travel of the recording medium (the Z direction) (or in still other words, disposed closer to the air-outflow end of the slider). However, the yoke layer 29 may be disposed below the pole layer 24, or in other words, disposed backward of the pole layer 24 along the direction of travel of the recording medium (the Z direction) (or in still other words, disposed closer to the air-inflow end of the slider).

The heater 13 is provided for heating the components of the write head including the pole layer 24 so as to control the distance between the recording medium and the end face of the pole layer 24 located in the medium facing surface 40. Two leads that are not shown are connected to the heater 13. The heater 13 is formed of, for example, a NiCr film or a layered film made up of a Ta film, a NiCu film and a Ta film. The heater 13 generates heat by being energized through the two leads, and thereby heats the components of the write head. As a result, the components of the write head expand and the end face of the pole layer 24 located in the medium facing surface 40 thereby gets closer to the recording medium.

Four of the eight terminals 212 provided in the slider 210 shown in FIG. 6 are respectively connected to the leads that are connected to the lower shield 3A for the element, the lower shield 3B for the sensor, the upper shield 8A for the element and the upper shield 8B for the sensor. Other two of the eight terminals 212 are connected to the coils 16 and 33, and the remaining two of the terminals 212 are connected to the two leads connected to the heater 13.

While FIG. 4 and FIG. 5 show a write head for a perpendicular magnetic recording system, the write head of the present embodiment may be one for a longitudinal magnetic recording system.

A method of manufacturing the thin-film magnetic head according to the present embodiment will now be outlined. In the method of manufacturing the thin-film magnetic head according to the embodiment, components of a plurality of thin-film magnetic heads are first formed on a single substrate (wafer) to thereby fabricate a substructure in which pre-slider portions each of which will be later formed into a slider are aligned in a plurality of rows. Next, the substructure is cut into a slider aggregate including a plurality of pre-slider portions aligned in a row. Next, a surface formed in the slider aggregate by cutting the substructure is polished to thereby form the medium facing surfaces 40 of the pre-slider portions included in the slider aggregate. Next, flying rails are formed in the medium facing surfaces 40. Next, the slider aggregate is cut to separate the plurality of pre-slider portions from one another. A plurality of sliders each of which includes the thin-film magnetic head are thereby formed.

Figure 1:
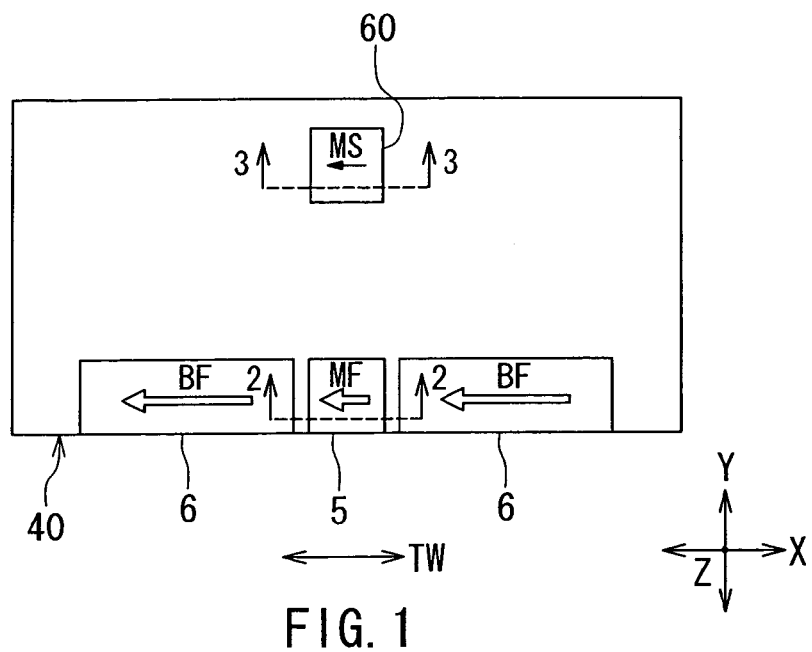
FIG. 1 is a plan view showing a main part of a magnetic detector according to a first embodiment of the present invention.
Figure 2:
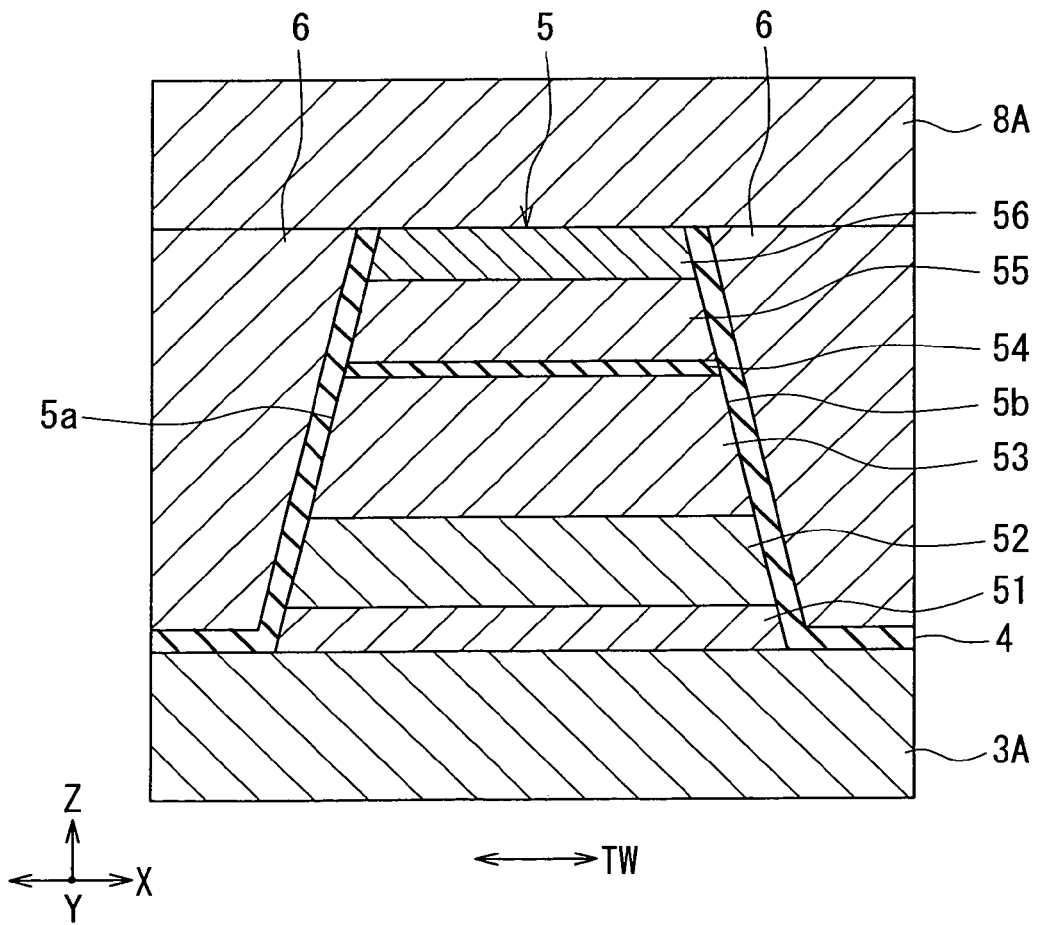
FIG. 2 is a cross-sectional view of the magnetic detector taken along line 2-2 of FIG. 1.
Figure 3:
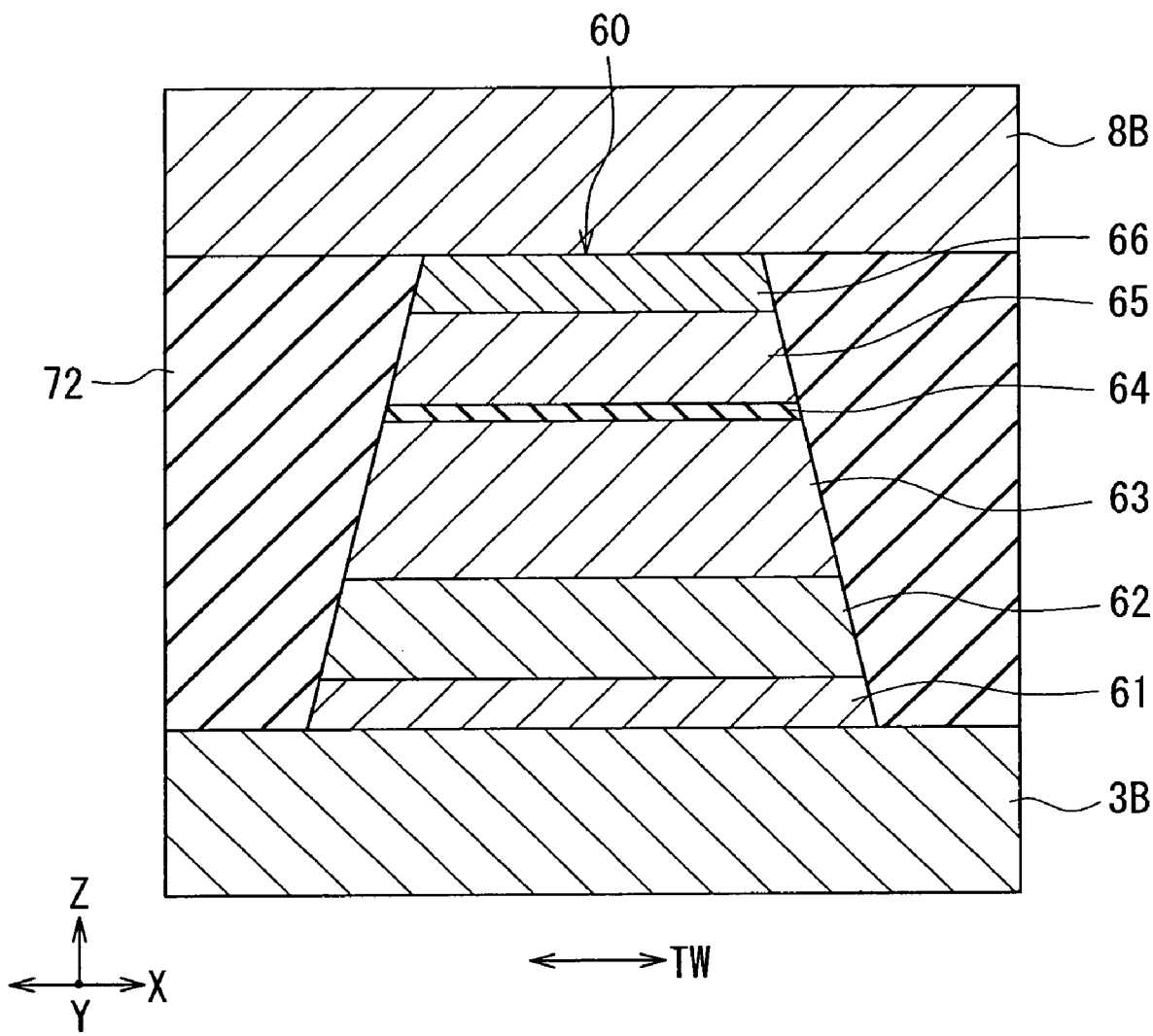
FIG. 3 is a cross-sectional view of the magnetic detector taken along line 3-3 of FIG. 1.

The configuration of the magnetic detector (read head) according to the present embodiment will now be described in detail with reference to FIG. 1 to FIG. 3. FIG. 1 is a plan view showing the MR element 5, the bias magnetic field applying layers 6 and the impact sensor 60 of the magnetic detector according to the present embodiment. FIG. 2 is a cross-sectional view of the magnetic detector taken along line 2-2 of FIG. 1. FIG. 3 is a cross-sectional view of the magnetic detector taken along line 3-3 of FIG. 1. The X, Y and Z directions shown in FIG. 6 are also shown in FIG. 1 to FIG. 3. In FIG. 1 the Z direction is orthogonal to the X and Y directions. In FIG. 2 and FIG. 3 the Y direction is orthogonal to the X and Z directions. In FIG. 1 to FIG. 3 the arrow TW indicates the track width direction. The track width direction TW is the same as the X direction.

As shown in FIG. 2, the magnetic detector includes: the lower shield 3A for the element and the upper shield 8A for the element disposed with a predetermined spacing; the MR element 5 disposed between the shields 3A and 8A; insulating films 4; and the two bias magnetic field applying layers 6 for applying a bias magnetic field to the MR element 5. The bias magnetic field applying layers 6 are disposed adjacent to two side surfaces 5a and 5b of the MR element 5 that are opposite to each other in the track width direction, with the insulating films 4 disposed between the MR element 5 and the respective bias magnetic field applying layers 6. The MR element 5 has an end face located in the medium facing surface 40. The medium facing surface 40 corresponds to the detecting surface of the magnetic detector that receives a magnetic field to be detected.

The bias magnetic field applying layers 6 generate a bias magnetic field in the track width direction. The bias magnetic field applying layers 6 correspond to the bias magnetic field applying layer for the element of the present invention. The bias magnetic field generated by the bias magnetic field applying layers 6 corresponds to the bias magnetic field for the element of the present invention. The insulating films 4 are disposed between the respective side surfaces of the MR element 5 and the bias magnetic field applying layers 6 and between the lower shield 3A for the element and the bias magnetic field applying layers 6. The shields 3A and 8A and the bias magnetic field applying layers 6 each have an end face located in the medium facing surface 40.

The shields 3A and 8A are formed of a soft magnetic material such as NiFe, CoFe, CoFeB, CoFeNi or FeN. The bias magnetic field applying layers 6 are formed of a hard magnetic layer or a stack of a ferromagnetic layer and an antiferromagnetic layer, for example. To be specific, the bias magnetic field applying layers 6 are formed of CoPt or CoCrPt, for example. The insulating films 4 are formed of alumina, for example.

The MR element 5 includes: a free layer 55 that is a ferromagnetic layer whose magnetization direction changes in response to a signal magnetic field; a pinned layer 53 that is a ferromagnetic layer whose magnetization direction is fixed; and a spacer layer 54 disposed between the free layer 55 and the pinned layer 53. In the example shown in FIG. 2, the pinned layer 53 is disposed closer to the lower shield 3A for the element than is the free layer 55. However, the reverse is possible, that is, the free layer 55 may be disposed closer to the lower shield 3A for the element than is the pinned layer 53.

The MR element 5 further includes: an antiferromagnetic layer 52 disposed on a side of the pinned layer 53 farther from the spacer layer 54; an underlying layer 51 disposed between the lower shield 3A for the element and the antiferromagnetic layer 52; and a protection layer 56 disposed between the free layer 55 and the upper shield 8A for the element. In the MR element 5 shown in FIG. 2, the underlying layer 51, the antiferromagnetic layer 52, the pinned layer 53, the spacer layer 54, the free layer 55 and the protection layer 56 are stacked in this order on the lower shield 3A for the element. The underlying layer 51, the antiferromagnetic layer 52, the pinned layer 53, the spacer layer 54, the free layer 55 and the protection layer 56 correspond to the plurality of element-constituent layers of the present invention.

The antiferromagnetic layer 52 is a layer for fixing the magnetization direction of the pinned layer 53 by means of exchange coupling with the pinned layer 53. The underlying layer 51 is provided for improving the crystallinity and orientability of each layer formed thereon and particularly for enhancing the exchange coupling between the antiferromagnetic layer 52 and the pinned layer 53. The protection layer 56 is a layer for protecting the layers located therebelow.

The underlying layer 51 is formed of a stack of a Ta layer and a Ru layer, for example. The antiferromagnetic layer 52 is formed of an antiferromagnetic material containing Mn and at least one element $M_{II}$ selected from the group consisting of Pt, Ru, Rh, Pd, Ni, Cu, Ir, Cr and Fe, for example. The Mn content of the material is preferably equal to or higher than 35 atomic percent and lower than or equal to 95 atomic percent, while the content of the other element $M_{II}$ of the material is preferably equal to or higher than 5 atomic percent and lower than or equal to 65 atomic percent. Examples of the antiferromagnetic material include a non-heat-induced antiferromagnetic material and a heat-induced antiferromagnetic material. The non-heat-induced antiferromagnetic material exhibits antiferromagnetism without any heat treatment and induces an exchange coupling magnetic field between a ferromagnetic material and itself. The heat-induced antiferromagnetic material exhibits antiferromagnetism by undergoing heat treatment. The antiferromagnetic layer 52 can be formed of either of these. Examples of the non-heat-induced antiferromagnetic material include a Mn alloy that has a γ phase, such as RuRhMn, FeMn, or IrMn. Examples of the heat-induced antiferromagnetic material include a Mn alloy that has a regular crystal structure, such as PtMn, NiMn, or PtRhMn.

As a layer for fixing the magnetization direction of the pinned layer 53, a hard magnetic layer formed of a hard magnetic material such as CoPt may be provided in place of the antiferromagnetic layer 52 described above. In this case, for example, Cr, CrTi or TiW is used as the material of the underlying layer 51.

The magnetization direction of the pinned layer 53 is fixed by exchange coupling with the antiferromagnetic layer 52 at the interface between the antiferromagnetic layer 52 and the pinned layer 53. The pinned layer 53 may be a so-called synthetic pinned layer having an outer magnetic layer, a nonmagnetic interlayer and an inner magnetic layer that are stacked in this order on the antiferromagnetic layer 52.

When the MR element 5 is a TMR element, the spacer layer 54 is a tunnel barrier layer. In this case, the spacer layer 54 is formed of an insulating material such as alumina, $SiO_2$ or MgO. When the MR element 5 is a GMR element of the CPP structure, the spacer layer 54 is a nonmagnetic conductive layer. In this case, the spacer layer 54 is formed of, for example, a nonmagnetic conductive material such as Ru, Rh, Ir, Re, Cr, Zr or Cu, or an oxide semiconductor material such as ZnO, $In_2O_3$ or $SnO_2$.

The free layer 55 is formed of a ferromagnetic layer having a low coercivity. The free layer 55 may include a plurality of ferromagnetic layers stacked. The protection layer 56 may be formed of a Ta layer or a Ru layer, for example. The protection layer 56 may be formed into a two-layer structure made up of a combination of a Ta layer and a Ru layer, for example, or a three-layer structure made up of a combination of Ta, Ru and Ta layers or a combination of Ru, Ta and Ru layers, for example.

The bias magnetic field applying layers 6 apply to the free layer 55 a bias magnetic field for directing the magnetization direction of the free layer 55 to a specific direction, that is, the track width direction, when in a state in which no signal magnetic field is applied. Consequently, when in a state in which no signal magnetic field applied, the magnetization direction of the free layer 55 is directed to the track width direction. In FIG. 1 the arrows 'BF' indicate the direction of the bias magnetic field generated by the bias magnetic field applying layers 6. The arrow 'MF' indicates the magnetization direction of the free layer 55 in a state in which no signal magnetic field is applied.

As shown in FIG. 3, the magnetic detector further includes the lower shield 3B for the sensor and the upper shield 8B for the sensor disposed with a predetermined spacing, and the impact sensor 60 disposed between the shields 3B and 8B. In the example shown FIG. 1, the impact sensor 60 is disposed away from the medium facing surface 40 which serves as the detecting surface of the magnetic detector. However, the impact sensor 60 may be disposed such that one of its end faces is exposed at the medium facing surface 40.

As shown in FIG. 3, the impact sensor 60 has a plurality of sensor-constituent layers that are made of materials the same as those of the plurality of element-constituent layers and stacked in the same order as the element-constituent layers. The plurality of sensor-constituent layers include an underlying layer 61, an antiferromagnetic layer 62, a pinned layer 63, a spacer layer 64, an impact detecting layer 65 and a protection layer 66 that are stacked in this order on the lower shield 3B for the sensor. The underlying layer 61, the antiferromagnetic layer 62, the pinned layer 63, the spacer layer 64, the impact detecting layer 65 and the protection layer 66 correspond respectively to the underlying layer 51, the antiferromagnetic layer 52, the pinned layer 53, the spacer layer 54, the free layer 55 and the protection layer 56 of the MR element 5. The impact detecting layer 65 is made of the same ferromagnetic material as the free layer 55. The impact detecting layer 65 has a non-zero magnetostriction constant. Ferromagnetic materials used for the free layer 55 each typically have a non-zero magnetostriction constant. Since the impact detecting layer 65 has a non-zero magnetostriction constant as mentioned above, the magnetization direction of the impact detecting layer 65 changes by the inverse magnetostrictive effect in response to distortion created in the impact detecting layer 65 by an impact received by the thin-film magnetic head, that is, an impact received by the magnetic detector.

While the bias magnetic field applying layers 6 are provided on opposite sides of the MR element 5 in the track width direction, no bias magnetic field applying layers are provided on opposite sides of the impact sensor 60 in the track width direction. Therefore, while the free layer 55 undergoes application of a bias magnetic field for directing the magnetization direction of the free layer 55 to a specific direction when in a state in which no signal magnetic field is applied, the impact detecting layer 65 does not undergo application of any magnetic field for directing the magnetization direction of the impact detecting layer 65 to a specific direction when in a state in which no signal magnetic field is applied.

In FIG. 1 the arrow 'MS' indicates the magnetization direction of the impact detecting layer 65 in a state immediately after the manufacture of the thin-film magnetic head in which no signal magnetic field is applied and no impact is given to the thin-film magnetic head (this state is hereinafter called an initial state). FIG. 1 shows an example in which the magnetization direction of the impact detecting layer 65 in the initial state is in the track width direction. However, the magnetization direction of the impact detecting layer 65 in the initial state may be in a direction other than the track width direction. The magnetization direction of the impact detecting layer 65 in the initial state is determined by factors such as the magnetic shape anisotropy of the impact detecting layer 65, magnetized components caused by the inverse magnetostrictive effect resulting from the stress present in the layers constituting the impact sensor 60 and the layers around the impact sensor 60 and from the non-zero magnetostriction constant of the impact detecting layer 65, and a magnetic field applied when annealing is performed during fabrication of the MR element 5 and the impact sensor 60 or applied when annealing is performed for defining the magnetization direction of the bias magnetic field applying layers 6.

As previously described, while the free layer 55 undergoes application of a bias magnetic field for directing the magnetization direction of the free layer 55 to a specific direction when in a state in which no signal magnetic field is applied, the impact detecting layer 65 does not undergo application of any magnetic field for directing the magnetization direction of the impact detecting layer 65 to a specific direction when in a state in which no signal magnetic field is applied. The magnetization of the impact detecting layer 65 in the initial state is therefore fixed more weakly, compared with the magnetization of the free layer 55. Consequently, the impact detecting layer 65 exhibits a greater amount of change in magnetization direction when the magnetic detector receives an impact, compared with the free layer 55.

Reference is now made to FIG. 10A to FIG. 16A and FIG. 10B to FIG. 16B to describe a method of fabricating the magnetic detector according to the present embodiment. FIG. 10A to FIG. 16A are plan views each showing a part of a stack of layers obtained in the process of fabricating the magnetic detector. FIG. 10B to FIG. 16B are cross-sectional views showing cross sections of the stack taken along lines 10B-10B to 16B-16B of FIG. 10A to FIG. 16A, respectively. The substrate 1 is omitted in FIG. 10B to FIG. 16B. In FIG. 10B to FIG. 16B the broken line with 'ABS' indicates the position at which the medium facing surface 40 is to be formed.

Figure 10A:
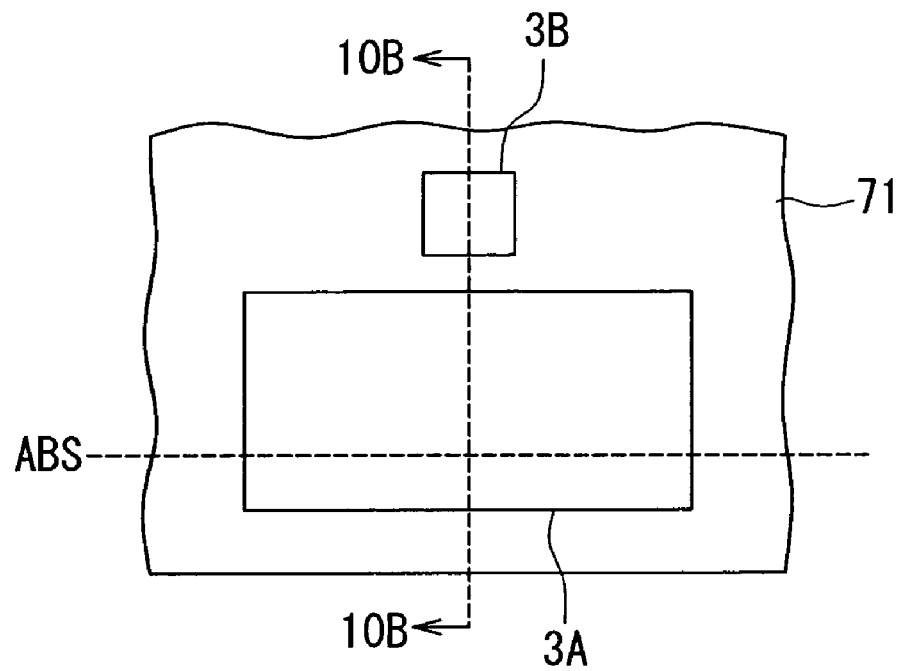
FIG. 10A and FIG. 10B are illustrative views showing a step of a method of fabricating the magnetic detector according to the first embodiment of the present invention.
Figure 10B:
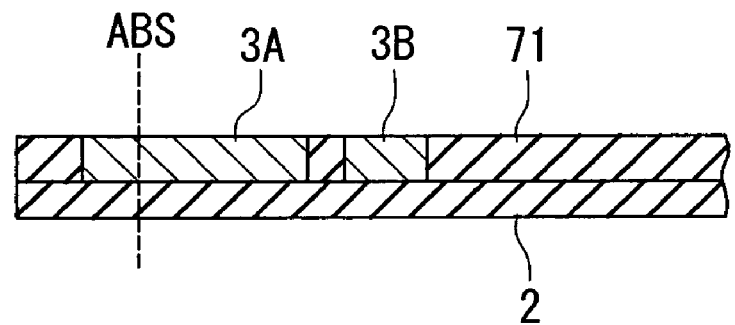

FIG. 10A and FIG. 10B show a step in the process of fabricating the magnetic detector. In this step, the lower shield 3A for the element and the lower shield 3B for the sensor are first formed on the insulating layer 2 by, e.g., frame plating. Next, the insulating layer 71 is formed to cover the lower shield 3A for the element, the lower shield 3B for the sensor and the insulating layer 2 by, e.g., sputtering. Next, the insulating layer 71 is polished by, e.g., chemical mechanical polishing (hereinafter referred to as CMP) until the lower shield 3A for the element and the lower shield 3B for the sensor become exposed, and the top surfaces of the lower shield 3A for the element, the lower shield 3B for the sensor and the insulating layer 71 are thereby flattened.

Figure 11A:
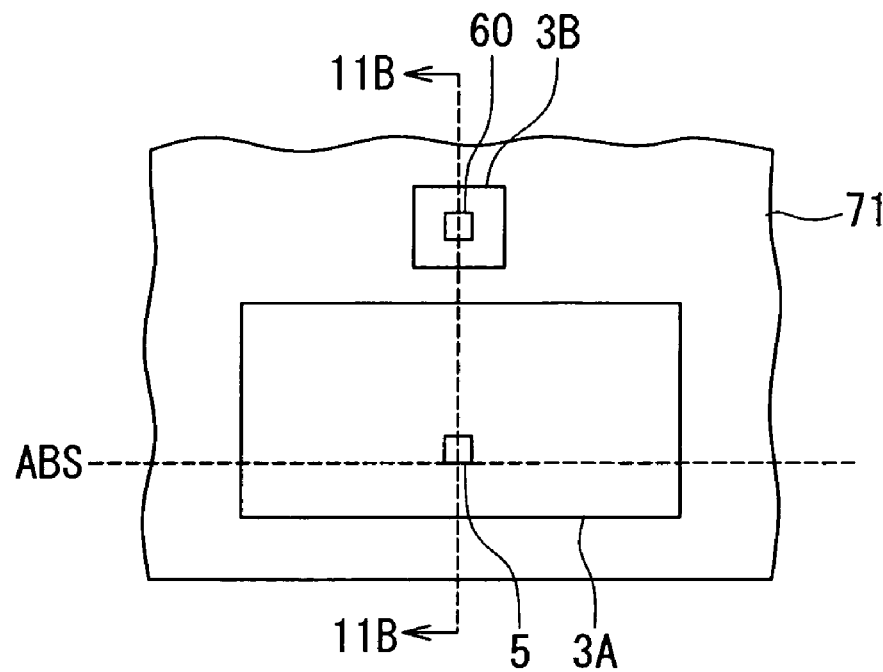
FIG. 11A and FIG. 11B are illustrative views showing a step that follows the step of FIG. 10A and FIG. 10B.
Figure 11B:
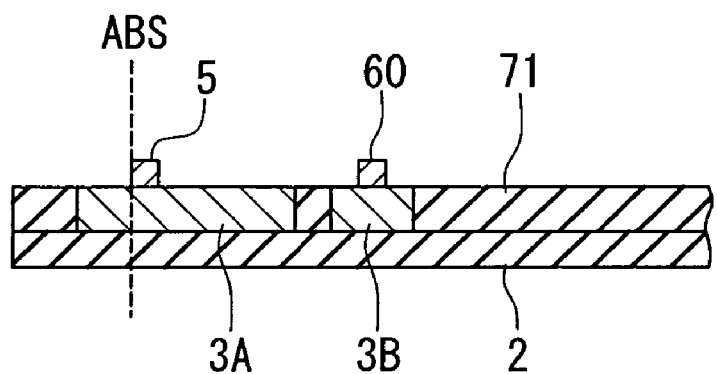

FIG. 11A and FIG. 11B show the next step. In this step, the MR element 5 is formed on the lower shield 3A for the element while the impact sensor 60 is formed on the lower shield 3B for the sensor. The MR element 5 and the impact sensor 60 are formed at the same time in the following manner. First, a layered film is formed on the flattened top surfaces of the lower shield 3A for the element, the lower shield 3B for the sensor and the insulating layer 71. The layered film is composed of a plurality of films that will be patterned later so as to be formed into the plurality of element-constituent layers and the plurality of sensor-constituent layers. Next, a mask for forming the MR element 5 and a mask for forming the impact sensor 60 are formed on this layered film. These masks are formed at the same time by patterning a photoresist layer by photolithography. Next, the layered film is selectively etched by using the above-mentioned masks. As a result, the MR element 5 is formed of a portion of the layered film remaining below the mask for forming the MR element 5 while the impact sensor 60 is formed of a portion of the layered film remaining below the mask for forming the impact sensor 60.

Figure 12A:
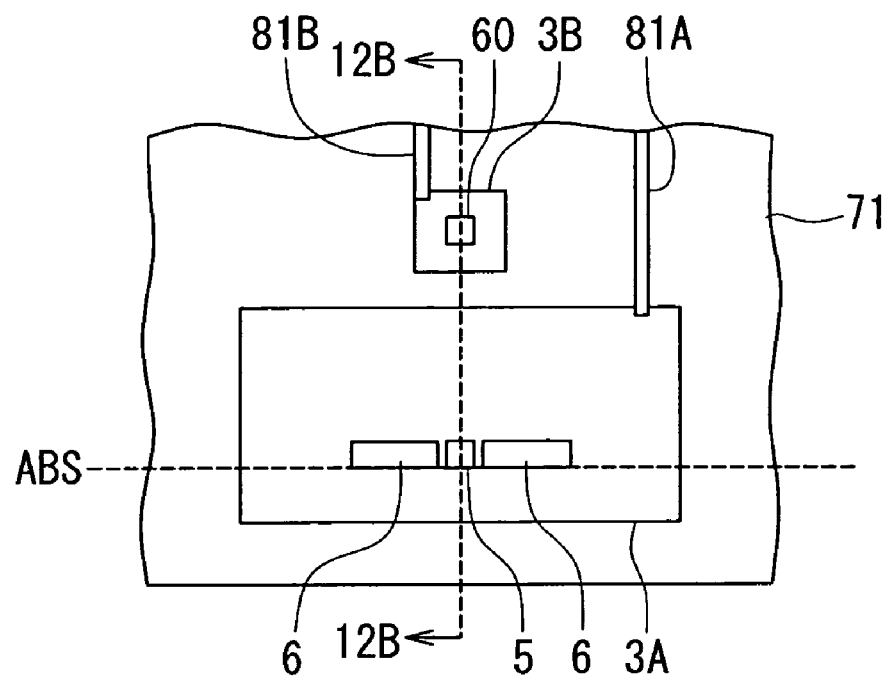
FIG. 12A and FIG. 12B are illustrative views showing a step that follows the step of FIG. 11A and FIG. 11B.
Figure 12B:
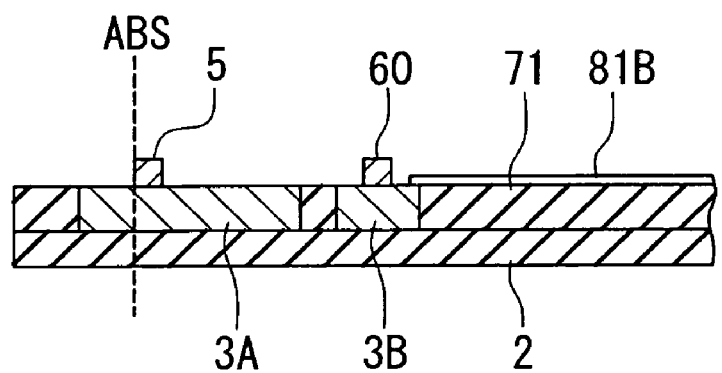

FIG. 12A and FIG. 12B show the next step. In this step, the insulating films 4 shown in FIG. 2 (although not shown in FIG. 12A and FIG. 12B) are formed to cover at least the side surfaces of the MR element 5 and portions of the top surface of the lower shield 3A for the element over which the bias magnetic field applying layers 6 are to lie. The insulating films 4 do not cover a portion of the top surface of the lower shield 3A for the element to which a lead that will be formed later is to be connected. Next, the two bias magnetic field applying layers 6 are formed on the insulating films 4.

Next, leads 81A and 81B made of a conductive material are formed on the insulating layer 71 by, e.g., frame plating. An end of the lead 81A is connected to the top surface of the lower shield 3A for the element. An end of the lead 81B is connected to the top surface of the lower shield 3B for the sensor. Alternatively, instead of forming the leads 81A and 81B in the step shown in FIG. 12A and FIG. 12B, the lead 81A may be formed to be contiguous with the lower shield 3A for the element while the lead 81B may be formed to be contiguous with the lower shield 3B for the sensor in the step shown in FIG. 10A and FIG. 10B.

Figure 13A:
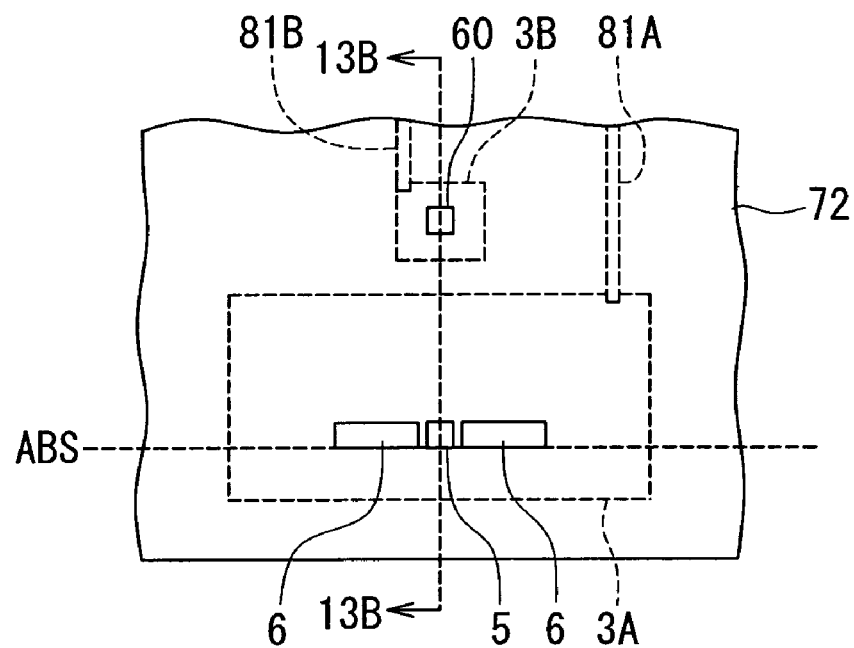
FIG. 13A and FIG. 13B are illustrative views showing a step that follows the step of FIG. 12A and FIG. 12B.
Figure 13B:
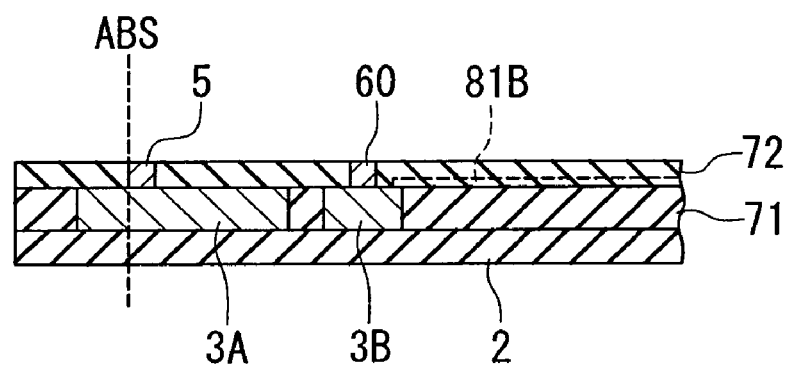

FIG. 13A and FIG. 13B show the next step. In this step, the insulating layer 72 is first formed to cover the entire top surface of the stack by, e.g., sputtering. Next, the insulating layer 72 is polished by, e.g., CMP until the top surfaces of the MR element 5 and the impact sensor 60 become exposed, and the top surfaces of the MR element 5, the impact sensor 60 and the insulating layer 72 are thereby flattened.

Figure 14A:
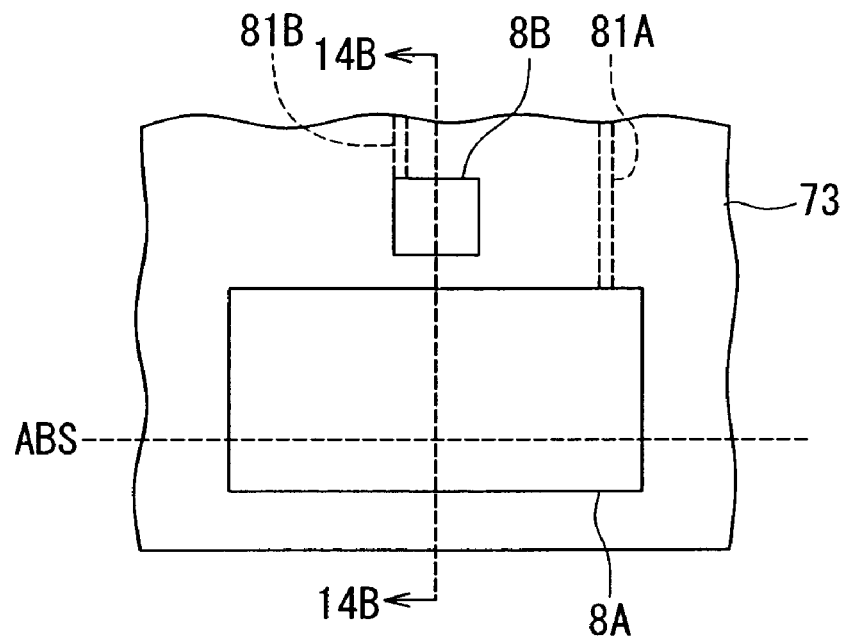
FIG. 14A and FIG. 14B are illustrative views showing a step that follows the step of FIG. 13A and FIG. 13B.
Figure 14B:
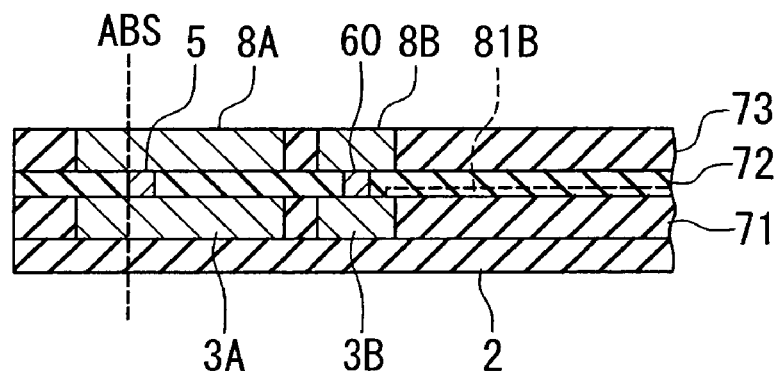

FIG. 14A and FIG. 14B show the next step. In this step, the upper shield 8A for the element is formed on the top surfaces of the MR element 5 and the insulating layer 72 while the upper shield 8B for the sensor is formed on the impact sensor 60 and the insulating layer 72, each by frame plating, for example. Next, the insulating layer 73 is formed to cover the upper shield 8A for the element, the upper shield 8B for the sensor and the insulating layer 72 by, e.g., sputtering. Next, the insulating layer 73 is polished by, e.g., CMP until the upper shield 8A for the element and the upper shield 8B for the sensor become exposed, and the top surfaces of the upper shield 8A for the element, the upper shield 8B for the sensor and the insulating layer 73 are thereby flattened.

Figure 15A:
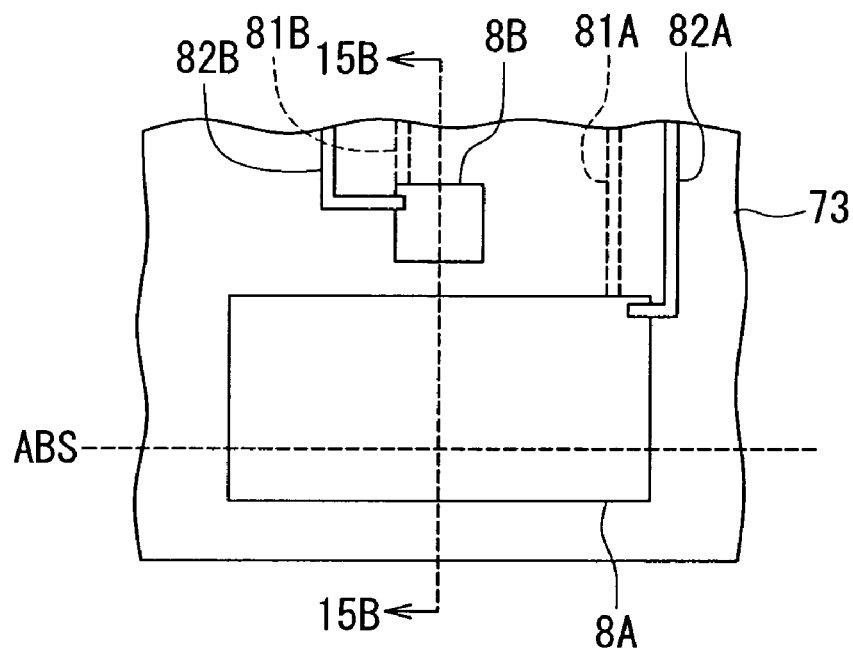
FIG. 15A and FIG. 15B are illustrative views showing a step that follows the step of FIG. 14A and FIG. 14B.
Figure 15B:
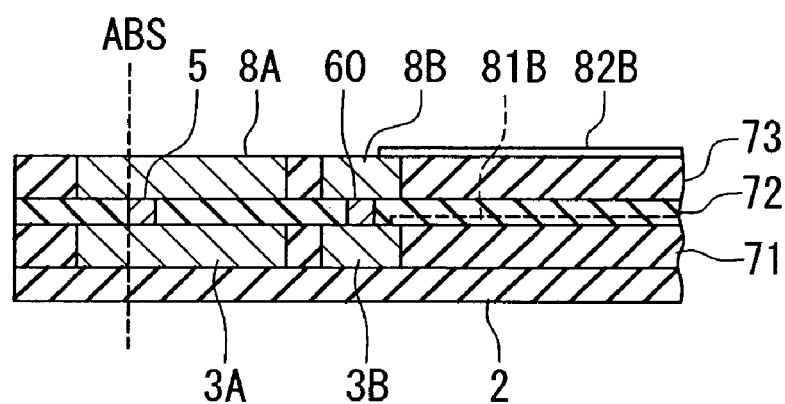

FIG. 15A and FIG. 15B show the next step. In this step, leads 82A and 82B made of a conductive material are formed on the insulating layer 73 by, e.g., frame plating. An end of the lead 82A is connected to the top surface of the upper shield 8A for the element. An end of the lead 82B is connected to the top surface of the upper shield 8B for the sensor. Alternatively, instead of forming the leads 82A and 82B in the step shown in FIG. 15A and FIG. 15B, the lead 82A may be formed to be contiguous with the upper shield 8A for the element while the lead 82B may be formed to be contiguous with the upper shield 8B for the sensor in the step shown in FIG. 14A and FIG. 14B. The magnetic detector is thus completed through the foregoing steps.

Figure 16A:
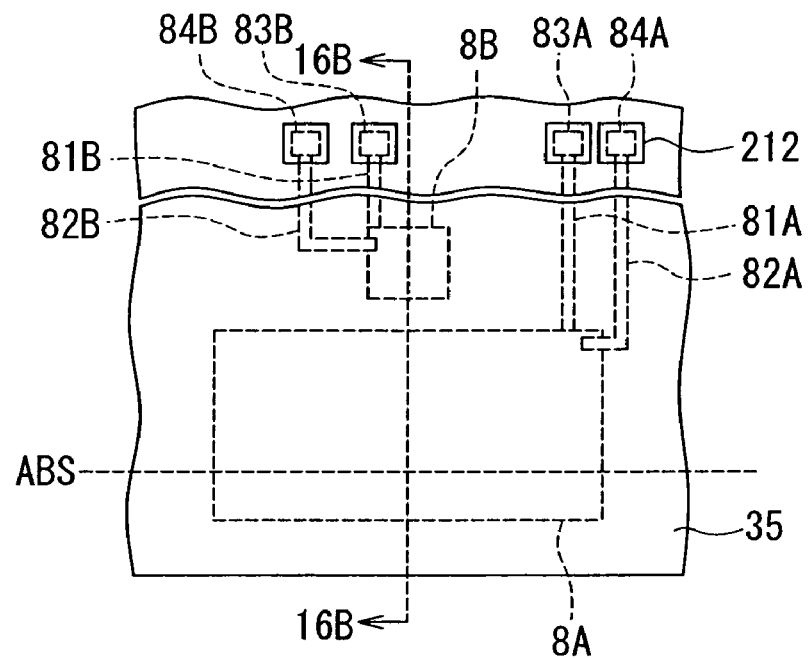
FIG. 16A and FIG. 16B are illustrative views showing a step that follows the step of FIG. 15A and FIG. 15B.
Figure 16B:
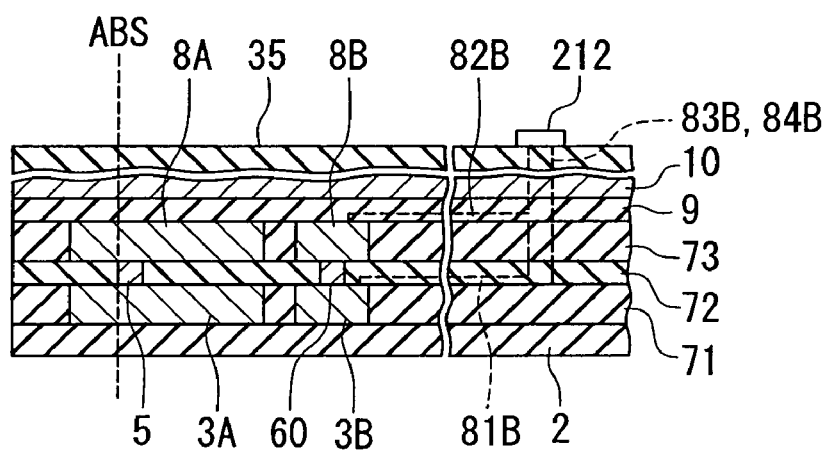

FIG. 16A and FIG. 16B show in brief steps performed after the magnetic detector is completed until the eight terminals 212 are formed. After the magnetic detector is completed, a step of forming the separating layer 9 to a step of forming the overcoat layer 35 are performed one by one, and then the eight terminals 212 are formed on the overcoat layer 35. Between the step of forming the separating layer 9 and the step of forming the overcoat layer 35, four through-hole rows 83A, 83B, 84A and 84B are formed to connect the leads 81A, 81B, 82A and 82B to the corresponding terminals 212, respectively. The stack shown in FIG. 16A and FIG. 16B will be polished later from the lower end of FIG. 16A and the left end of FIG. 16B to the level indicated with 'ABS' in the polishing process for forming the medium facing surface 40.

The functions of the MR element 5 and the impact sensor 60 will now be described. A sense current is fed to the MR element 5 through the corresponding two of the terminals 212, the through-hole rows 83A and 84A, the leads 81A and 82A, and the shields 3A and 8A. It is possible to determine the resistance of the MR element 5 from the sense current. In the MR element 5 the magnetization direction of the free layer 55 changes in response to a signal magnetic field sent from the recording medium, and the resistance of the MR element 5 thereby changes. It is therefore possible to detect the signal magnetic field by detecting the resistance of the MR element 5.

On the other hand, a sense current is fed to the impact sensor 60 through the corresponding two of the terminals 212, the through-hole rows 83B and 84B, the leads 81B and 82B, and the shields 3B and 8B. It is possible to determine the resistance of the impact detecting layer 65 from the sense current. When the thin-film magnetic head (magnetic detector) receives an impact due to, e.g., a collision of the slider 210 with the recording medium, in the impact sensor 60 the magnetization direction of the impact detecting layer 65 abruptly changes by the inverse magnetostrictive effect in response to distortion created in the impact detecting layer 65 by the impact. Since the impact sensor 60 has the same configuration as the MR element 5, an abrupt change in magnetization direction of the impact detecting layer 65 due to an impact causes an abrupt change in resistance of the impact sensor 60. It is therefore possible to detect an impact on thin-film magnetic head (magnetic detector) by detecting an abrupt change in resistance of the impact sensor 60.

According to the present embodiment thus described, it is possible with the impact sensor 60 to detect an impact on the thin-film magnetic head (magnetic detector). The impact sensor 60 has the plurality of sensor-constituent layers that are made of materials the same as those of the plurality of element-constituent layers of the MR element 5 and stacked in the same order as the element-constituent layers. The impact detecting layer 65 of the impact sensor 60 corresponding to the free layer 55 of the MR element 5 exhibits a greater amount of change in magnetization direction when an impact is received, compared with the free layer 55. Consequently, according to the present embodiment, it is possible with the impact sensor 60 to detect an impact without affecting the characteristics of the MR element 5. To be specific, in order to detect an impact through the use of the MR element 5, it is required that the free layer 55 have a magnetostriction constant whose absolute value is large, which is not desirable for the characteristics of the MR element 5. According to the present embodiment, even if the free layer 55 and the impact detecting layer 65 have a magnetostriction constant whose absolute value is small, detection of an impact is possible with the impact detecting layer 65 since the impact detecting layer 65 exhibits a greater amount of change in magnetization direction when an impact is received, compared with the free layer 55.

Furthermore, according to the present embodiment, it is possible to form the impact sensor 60 at the same time as the MR element 5, since the impact sensor 60 has the plurality of sensor-constituent layers that are made of materials the same as those of the plurality of element-constituent layers of the MR element 5 and stacked in the same order as the element-constituent layers. More specifically, according to the present embodiment, it is possible to form the MR element 5 and the impact sensor 60 at the same time by patterning one layered film through the use of two masks as described with reference to FIG. 11A and FIG. 11B. The present embodiment thus makes it possible to prevent the manufacturing process of the thin-film magnetic head from being complicated due to the provision of the impact sensor 60.

In order for a sensor to detect a temperature rise at or near the medium facing surface that occurs upon a collision of the thin-film magnetic head with the recording medium, it is required that the sensor be placed near the medium facing surface. According to the present embodiment, in contrast, the impact sensor 60 detects an impact on the thin-film magnetic head, not a temperature rise. The impact is not localized only at and near the medium facing surface 40 but is transmitted to a region far from the medium facing surface 40. Therefore, according to the present embodiment, it is possible to detect an impact on the thin-film magnetic head no matter where the impact sensor 60 is placed in the thin-film magnetic head. The impact sensor 60 thus has a higher degree of flexibility in placement, compared with a sensor that detects a temperature rise.

Figure 17:
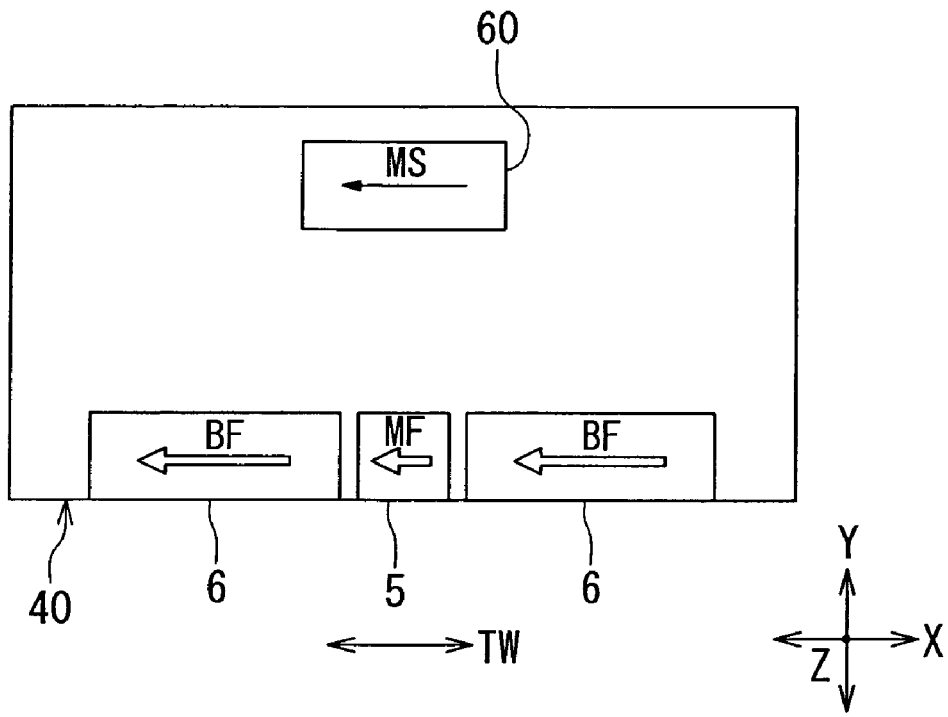
FIG. 17 is a plan view showing a main part of a first modification example of the magnetic detector according to the first embodiment of the present invention.
Figure 18:
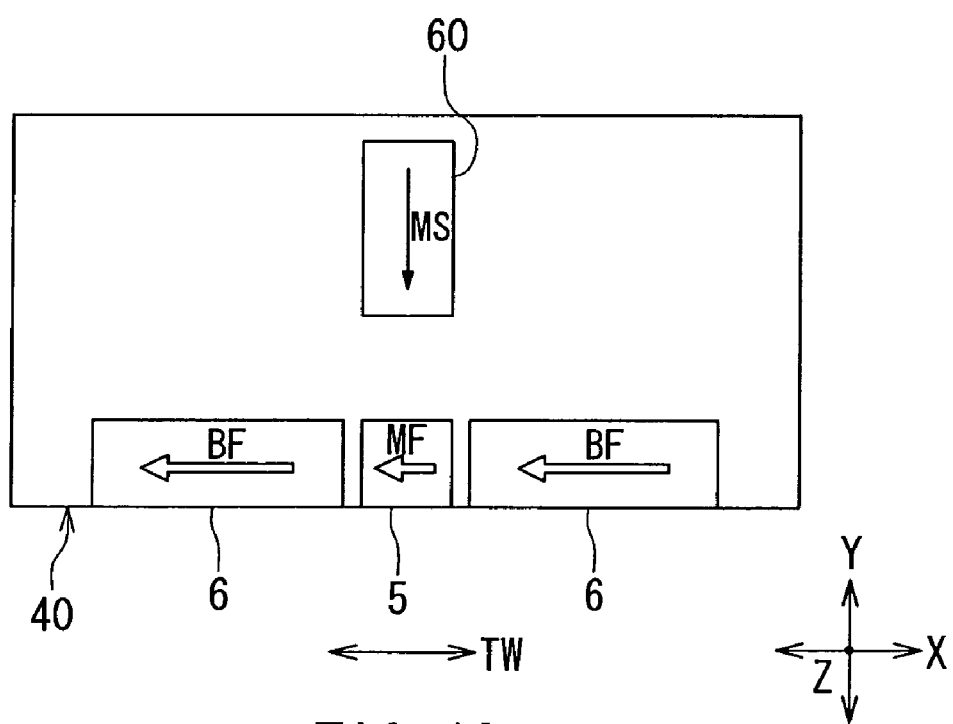
FIG. 18 is a plan view showing a main part of a second modification example of the magnetic detector according to the first embodiment of the present invention.

Reference is now made to FIG. 17 and FIG. 18 to describe first and second modification examples of the magnetic detector according to the present embodiment. FIG. 17 is a plan view showing a main part of the first modification example of the magnetic detector. In the first modification example the plane geometry (the shape as seen from above) of the impact sensor 60 is long in the track width direction. Accordingly, in the first modification example, the impact detecting layer 65 has a magnetic shape anisotropy that generates an anisotropic magnetic field in the track width direction. Mainly because of this magnetic shape anisotropy, the magnetization direction of the impact detecting layer 65 in the initial state is in the track width direction. The anisotropic magnetic field created by the magnetic shape anisotropy of the impact detecting layer 65 is smaller than the bias magnetic field applied to the free layer 55. Consequently, the magnetization of the impact detecting layer 65 in the initial state is fixed more weakly than the magnetization of the free layer 55. The impact detecting layer 65 therefore exhibits a greater amount of change in magnetization direction when the magnetic detector receives an impact, compared with the free layer 55.

FIG. 18 is a plan view showing a main part of the second modification example of the magnetic detector. In the second modification example the plane geometry of the impact sensor 60 is long in the direction orthogonal to the medium facing surface 40. Accordingly, in the second modification example, the impact detecting layer 65 has a magnetic shape anisotropy that generates an anisotropic magnetic field in the direction orthogonal to the medium facing surface 40. Mainly because of this magnetic shape anisotropy, the magnetization direction of the impact detecting layer 65 in the initial state is orthogonal to the medium facing surface 40. The anisotropic magnetic field created by the magnetic shape anisotropy of the impact detecting layer 65 is smaller than the bias magnetic field applied to the free layer 55. Consequently, the magnetization of the impact detecting layer 65 in the initial state is fixed more weakly than the magnetization of the free layer 55. The impact detecting layer 65 therefore exhibits a greater amount of change in magnetization direction when the magnetic detector receives an impact, compared with the free layer 55.

Second Embodiment

Figure 19:
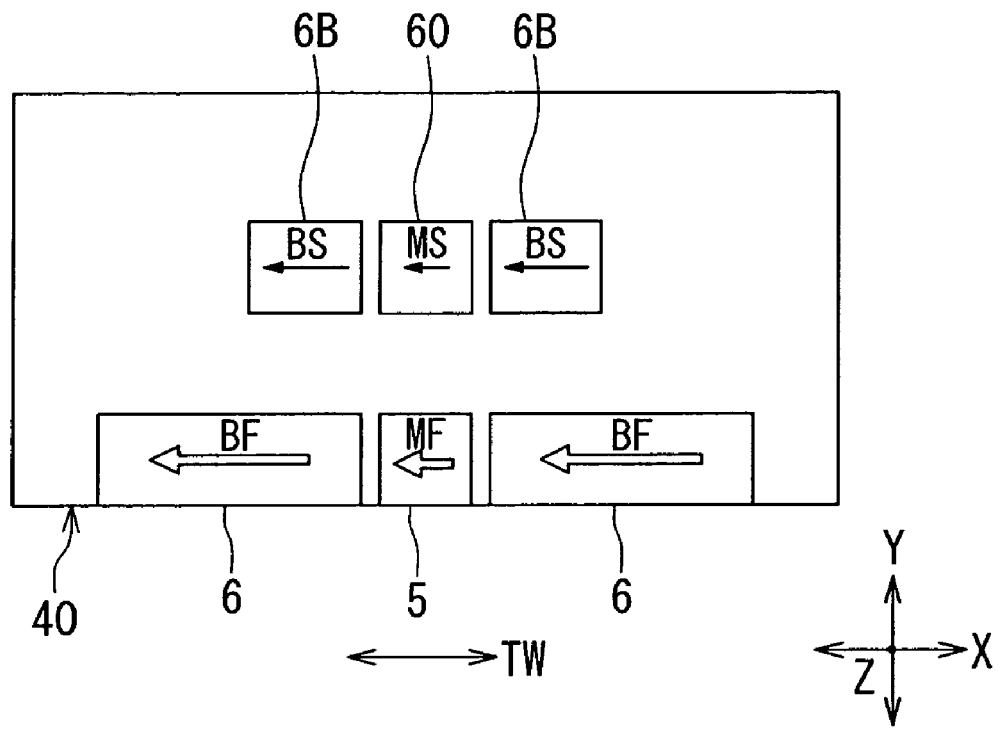
FIG. 19 is a plan view showing a main part of a magnetic detector according to a second embodiment of the present invention.

Reference is now made to FIG. 19 to describe a second embodiment of the present invention. FIG. 19 is a plan view showing a main part of a magnetic detector according to the second embodiment. In the second embodiment, as shown in FIG. 19, two bias magnetic field applying layers 6B for the sensor are provided on opposite sides of the impact sensor 60 in the track width direction, with insulating films (not shown) provided between the impact sensor 60 and the respective layers 6B. The bias magnetic field applying layers 6B for the sensor generate a bias magnetic field for the sensor in the track width direction. The magnetization direction of the impact detecting layer 65 in the initial state is directed to the track width direction by the bias magnetic field for the sensor. In FIG. 19 the arrows 'BS' indicate the direction of the bias magnetic field for the sensor generated by the bias magnetic field applying layers 6B for the sensor.

The bias magnetic field applying layers 6B for the sensor are made of a material the same as that of the bias magnetic field applying layers 6. The bias magnetic field applying layers 6 and the bias magnetic field applying layers 6B for the sensor each have a plane geometry that is long in the track width direction, thereby having a magnetic shape anisotropy that generates an anisotropic magnetic field in the track width direction. However, the length of the bias magnetic field applying layers 6B for the sensor taken in the track width direction is smaller than the length of the bias magnetic field applying layers 6 taken in the track width direction. The magnetic shape anisotropy of the bias magnetic field applying layers 6B for the sensor is therefore smaller than that of the bias magnetic field applying layers 6. Consequently, the bias magnetic field for the sensor generated by the bias magnetic field applying layers 6B for the sensor is smaller than the bias magnetic field generated by the bias magnetic field applying layers 6. The magnetization of the impact detecting layer 65 in the initial state is therefore fixed more weakly than the magnetization of the free layer 55. Accordingly, the impact detecting layer 65 exhibits a greater amount of change in magnetization direction when the magnetic detector receives an impact, compared with the free layer 55.

In a method of fabricating the magnetic detector according to the second embodiment, the insulating films disposed between the impact sensor 60 and the two bias magnetic field applying layers 6B for the sensor are formed at the same time as the insulating films 4, using a material the same as that of the insulating films 4. The bias magnetic field applying layers 6B for the sensor are formed at the same time as the bias magnetic field applying layers 6, using a material the same as that of the bias magnetic field applying layers 6.

The remainder of configuration, functions and advantageous effects of the second embodiment are similar to those of the first embodiment.

Third Embodiment

Figure 20:
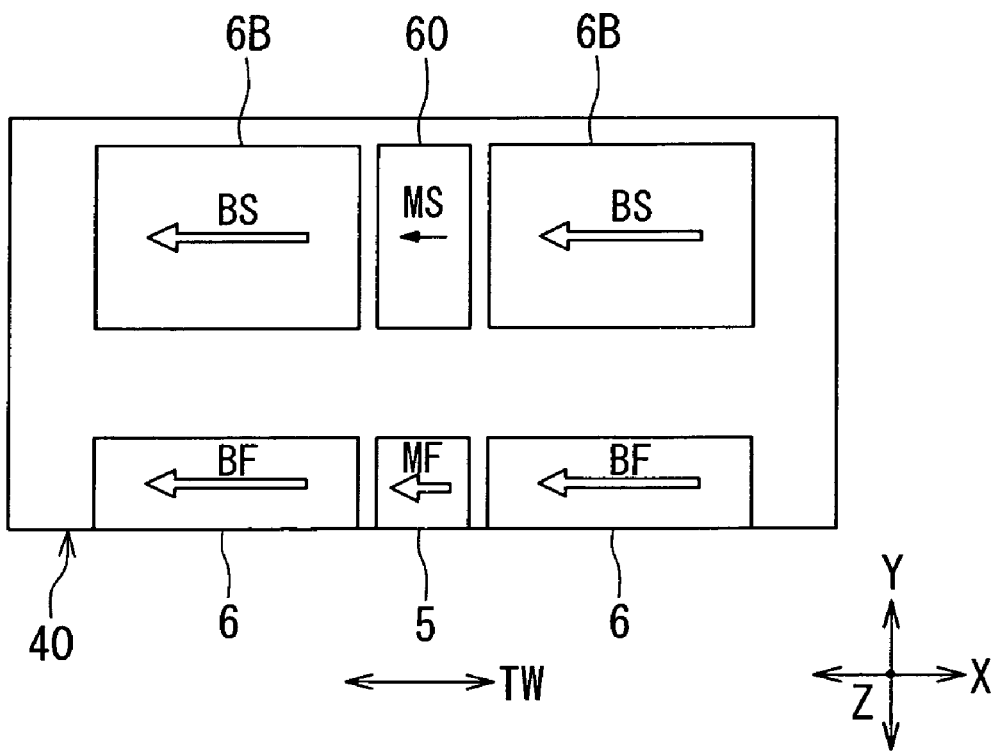
FIG. 20 is a plan view showing a main part of a magnetic detector according to a third embodiment of the present invention.

Reference is now made to FIG. 20 to describe a third embodiment of the present invention. FIG. 20 is a plan view showing a main part of a magnetic detector according to the third embodiment. In the third embodiment, as in the second embodiment, two bias magnetic field applying layers 6B for the sensor are provided on opposite sides of the impact sensor 60 in the track width direction with insulating films provided between the impact sensor 60 and the respective layers 6B, as shown in FIG. 20. The bias magnetic field applying layers 6B for the sensor generate a bias magnetic field for the sensor in the track width direction. In the third embodiment the length of the bias magnetic field applying layers 6B for the sensor taken in the track width direction is equal to the length of the bias magnetic field applying layers 6 taken in the track width direction. The magnitude of the bias magnetic field for the sensor is equal to or nearly equal to the magnitude of the bias magnetic field generated by the bias magnetic field applying layers 6.

In the third embodiment the impact sensor 60 has a plane geometry that is long in the direction orthogonal to the medium facing surface 40, and has a magnetic shape anisotropy that generates an anisotropic magnetic field in the direction intersecting the bias magnetic field for the sensor at a right angle, that is, in the direction orthogonal to the medium facing surface 40. However, this anisotropic magnetic field is smaller than the bias magnetic field for the sensor. Consequently, in the third embodiment the magnetization direction of the impact detecting layer 65 in the initial state is in the track width direction. In the third embodiment the magnitude of the bias magnetic field for the sensor generated by the bias magnetic field applying layers 6B for the sensor is equal to or nearly equal to the bias magnetic field generated by the bias magnetic field applying layers 6, and the impact sensor 60 has a magnetic shape anisotropy that generates an anisotropic magnetic field that is smaller than the bias magnetic field for the sensor and is in the direction intersecting the bias magnetic field for the sensor at a right angle. The magnetization of the impact detecting layer 65 in the initial state is therefore fixed more weakly than the magnetization of the free layer 55. Accordingly, the impact detecting layer 65 exhibits a greater amount of change in magnetization direction when the magnetic detector receives an impact, compared with the free layer 55.

The remainder of configuration, functions and advantageous effects of the third embodiment are similar to those of the second embodiment.

Fourth Embodiment

Figure 21:
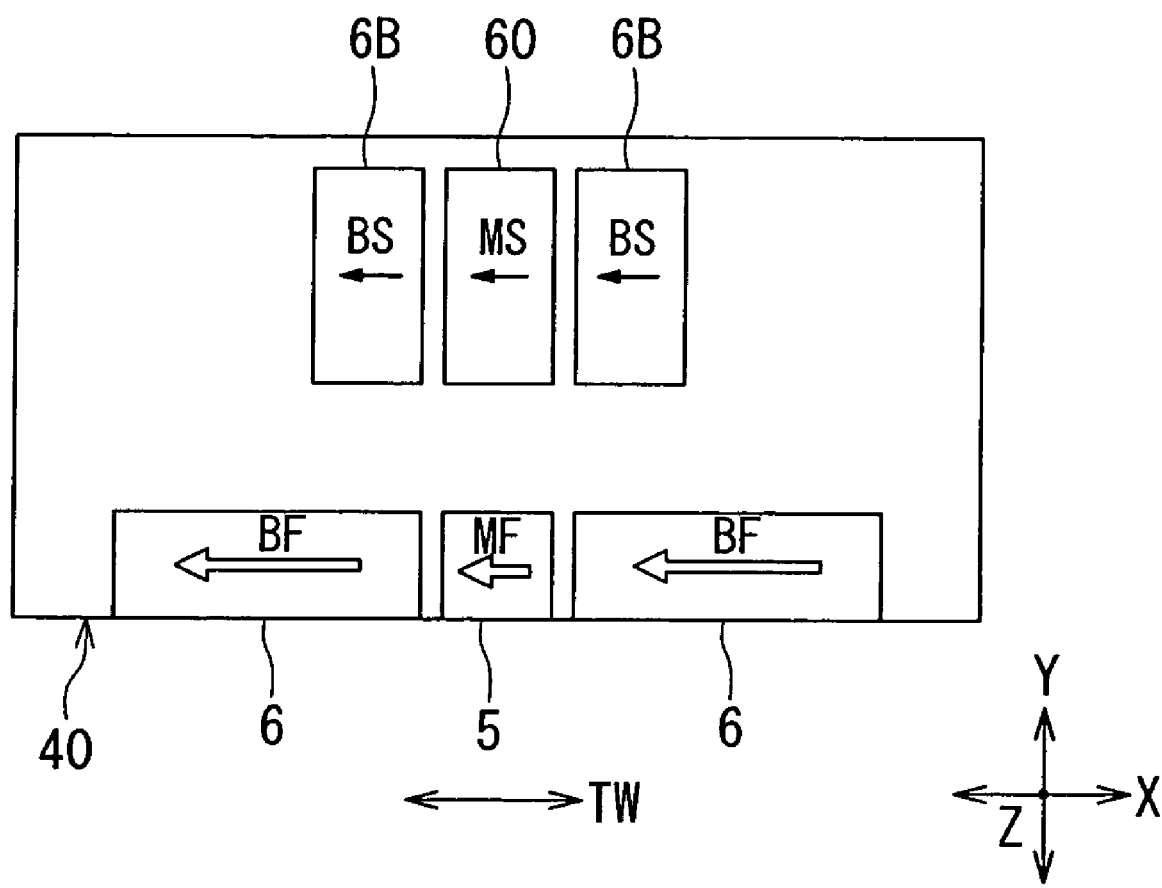
FIG. 21 is a plan view showing a main part of a magnetic detector according to a fourth embodiment of the present invention.

Reference is now made to FIG. 21 to describe a fourth embodiment of the present invention. FIG. 21 is a plan view showing a main part of a magnetic detector according to the fourth embodiment. In the fourth embodiment, as in the second embodiment, two bias magnetic field applying layers 6B for the sensor are provided on opposite sides of the impact sensor 60 in the track width direction with insulating films (not shown) provided between the impact sensor 60 and the respective layers 6B, as shown in FIG. 21. The bias magnetic field applying layers 6B for the sensor generate a bias magnetic field for the sensor in the track width direction.

In the fourth embodiment, the bias magnetic field applying layers 6 have a plane geometry that is long in the track width direction whereas the bias magnetic field applying layers 6B for the sensor have a plane geometry that is long in the direction orthogonal to the medium facing surface 40. The bias magnetic field for the sensor generated by the bias magnetic field applying layers 6B for the sensor is therefore smaller than the bias magnetic field generated by the bias magnetic field applying layers 6.

In the fourth embodiment, as in the third embodiment, the impact sensor 60 has a plane geometry that is long in the direction orthogonal to the medium facing surface 40, and has a magnetic shape anisotropy that generates an anisotropic magnetic field in the direction intersecting the bias magnetic field for the sensor at a right angle, that is, in the direction orthogonal to the medium facing surface 40. However, this anisotropic magnetic field is smaller than the bias magnetic field for the sensor. Consequently, in the fourth embodiment, the magnetization direction of the impact detecting layer 65 in the initial state is in the track width direction. In the fourth embodiment the bias magnetic field for the sensor generated by the bias magnetic field applying layers 6B for the sensor is smaller than the bias magnetic field generated by the bias magnetic field applying layers 6, and the impact sensor 60 has a magnetic shape anisotropy that generates an anisotropic magnetic field that is smaller than the bias magnetic field for the sensor and is in the direction intersecting the bias magnetic field for the sensor at a right angle. The magnetization of the impact detecting layer 65 in the initial state is therefore fixed more weakly than the magnetization of the free layer 55. Accordingly, the impact detecting layer 65 exhibits a greater amount of change in magnetization direction when the magnetic detector receives an impact, compared with the free layer 55.

The remainder of configuration, functions and advantageous effects of the fourth embodiment are similar to those of the second embodiment.

The present invention is not limited to the foregoing embodiments but can be carried out in various modifications. For example, two of the terminals 212 may be shared between the impact sensor 60 and the heater 13. More specifically, the impact sensor 60 may be connected to the two terminals 212 that are connected to the heater 13, instead of providing two terminals 212 dedicated to the impact sensor 60 in the slider 210. In this case it suffices to provide six terminals 212 in the slider 210.

It is not necessarily required to provide the lower and upper shields 3B and 8B for the sensor. However, it is preferred to provide the shields 3B and 8B since the impact sensor 60 is preferably insensitive to an external magnetic field.

The MR element 5 is not limited to a TMR element or a GMR element having a CPP structure illustrated in the embodiments, but may be an MR element of any other type such as a GMR element having a CIP (current in plane) structure in which the sense current is fed in a direction parallel to the planes of the layers constituting the MR element.

While the foregoing embodiments have been described with reference to a thin-film magnetic head having a structure in which the read head is formed on the base body and the write head is stacked on the read head, the read head and the write head may be stacked in the reverse order. If the thin-film magnetic head is to be used only for read operations, the thin-film magnetic head may be configured to include the read head only.

The present invention is applicable not only to a magnetic detector that is used as the read head of a thin-film magnetic head, but also to any magnetic detectors used for various purposes in general.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetic detector comprising a magnetoresistive element and an impact sensor, wherein:
    the magnetoresistive element has a plurality of element-constituent layers that are stacked and include a free layer, the free layer having a magnetization direction that changes in response to a magnetic field to be detected by the magnetic detector;
    the impact sensor has a plurality of sensor-constituent layers that are made of materials the same as those of the plurality of element-constituent layers and stacked in an order the same as the plurality of element-constituent layers;
    the plurality of sensor-constituent layers include an impact detecting layer, the impact detecting layer corresponding to the free layer and having a magnetization direction that changes by an inverse magnetostrictive effect in response to distortion created in the impact detecting layer by an impact received by the magnetic detector; and
    the impact detecting layer exhibits a greater amount of change in magnetization direction when the magnetic detector receives an impact, compared with the free layer.

2. The magnetic detector according to claim 1, further comprising a bias magnetic field applying layer for the element, for applying to the free layer a bias magnetic field for the element for directing the magnetization direction of the free layer to a specific direction when the magnetic detector is in a state in which the magnetic field to be detected is not applied thereto.

3. The magnetic detector according to claim 2, wherein the impact detecting layer does not undergo application of any magnetic field intended for directing the magnetization direction of the impact detecting layer to a specific direction when the magnetic detector is in a state in which the magnetic field to be detected is not applied thereto.

4. The magnetic detector according to claim 2, further comprising a bias magnetic field applying layer for the sensor, for applying to the impact detecting layer a bias magnetic field for the sensor for directing the magnetization direction of the impact detecting layer to a specific direction when the magnetic detector is in a state in which the magnetic field to be detected is not applied thereto,
    wherein the bias magnetic field for the sensor is smaller in magnitude than the bias magnetic field for the element.

5. The magnetic detector according to claim 2, further comprising a bias magnetic field applying layer for the sensor, for applying to the impact detecting layer a bias magnetic field for the sensor for directing the magnetization direction of the impact detecting layer to a specific direction when the magnetic detector is in a state in which the magnetic field to be detected is not applied thereto,
    wherein the impact detecting layer has a magnetic shape anisotropy that generates an anisotropic magnetic field that is smaller than the bias magnetic field for the sensor and that is in a direction intersecting the bias magnetic field for the sensor at a right angle.

6. The magnetic detector according to claim 1, wherein the plurality of element-constituent layers further include a pinned layer having a fixed magnetization direction, and a spacer layer made of a nonmagnetic material and disposed between the free layer and the pinned layer.

7. The magnetic detector according to claim 1, further comprising a detecting surface that receives the magnetic field to be detected, wherein:
    the magnetoresistive element has an end face located in the detecting surface; and
    the impact sensor is disposed away from the detecting surface.

8. A thin-film magnetic head comprising: a medium facing surface that faces toward a recording medium; a magnetoresistive element disposed near the medium facing surface to detect a signal magnetic field sent from the recording medium; and an impact sensor, wherein:
    the magnetoresistive element has a plurality of element-constituent layers that are stacked and include a free layer, the free layer having a magnetization direction that changes in response to the signal magnetic field;
    the impact sensor has a plurality of sensor-constituent layers that are made of materials the same as those of the plurality of element-constituent layers and stacked in an order the same as the plurality of element-constituent layers;
    the plurality of sensor-constituent layers include an impact detecting layer, the impact detecting layer corresponding to the free layer and having a magnetization direction that changes by an inverse magnetostrictive effect in response to distortion created in the impact detecting layer by an impact received by the thin-film magnetic head; and
    the impact detecting layer exhibits a greater amount of change in magnetization direction when the thin-film magnetic head receives an impact, compared with the free layer.

9. A head assembly comprising: a slider disposed to face toward a recording medium; and a supporter flexibly supporting the slider, the slider including the thin-film magnetic head according to claim 8.

10. A magnetic disk drive comprising: a slider disposed to face toward a recording medium that is driven to rotate; and an alignment device supporting the slider and aligning the slider with respect to the recording medium, the slider including the thin-film magnetic head according to claim 8.

* * * * *